(12) United States Patent
Sung et al.

(10) Patent No.: US 10,170,484 B1
(45) Date of Patent: Jan. 1, 2019

(54) INTEGRATED CIRCUIT STRUCTURE INCORPORATING MULTIPLE GATE-ALL-AROUND FIELD EFFECT TRANSISTORS HAVING DIFFERENT DRIVE CURRENTS AND METHOD

(71) Applicant: GLOBALFOUNDRIES INC., Grand Cayman (KY)

(72) Inventors: Min Gyu Sung, Latham, NY (US); Ruilong Xie, Schenectady, NY (US); Bipul C. Paul, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/787,009

(22) Filed: Oct. 18, 2017

(51) Int. Cl.
| H01L 21/00 | (2006.01) |
| H01L 27/11 | (2006.01) |
| H01L 29/66 | (2006.01) |
| H01L 27/088 | (2006.01) |
| H01L 29/10 | (2006.01) |
| H01L 29/417 | (2006.01) |
| H01L 29/78 | (2006.01) |

(52) U.S. Cl.
CPC ...... *H01L 27/1104* (2013.01); *H01L 27/0886* (2013.01); *H01L 29/1033* (2013.01); *H01L 29/41791* (2013.01); *H01L 29/66795* (2013.01); *H01L 29/785* (2013.01); *H01L 2029/7858* (2013.01)

(58) Field of Classification Search
CPC ............. H01L 27/1104; H01L 27/0886; H01L 29/1033; H01L 29/41791; H01L 29/66795; H01L 29/785; H01L 2029/7858
See application file for complete search history.

(56) References Cited

U.S. PATENT DOCUMENTS 7,601,570 B2   10/2009  Damlencourt
8,173,993 B2   5/2012   Bangsaruntip et al.
(Continued)

OTHER PUBLICATIONS

Jacob et al., "Scaling Challenges for Advanced CMOS Devices", International Journal of High Speed Electronics and Systems, vol. 26, No. 1 (2017) 1740001, pp. 1-76.
(Continued)

*Primary Examiner* — Charles Garber
*Assistant Examiner* — Abdulfattah Mustapha
(74) *Attorney, Agent, or Firm* — Gibb & Riley, LLC; Anthony J. Canale

(57) ABSTRACT

In a method of forming a structure with field effect transistors (FETs) having different drive currents, a stack is formed on a substrate. The substrate is a first semiconductor material and the stack includes alternating layers of a second and the first semiconductor material. Recess(es) filled with sacrificial material are formed in certain area(s) of the stack. The stack is patterned into fins and gate-all-around (GAA) FET processing is performed. GAAFET processing includes removing sacrificial gates to form gate openings for GAAFETs and removing the second semiconductor material and any sacrificial material (if present) from the gate openings such that, within each gate opening, nanoshape(s) that extend laterally between source/drain regions remain. Gate openings for GAAFETs where sacrificial material was removed will have fewer nanoshapes than other gate openings. Thus, in the structure, some GAAFETs will have fewer channel regions and, thereby lower drive currents than others.

20 Claims, 19 Drawing Sheets

(56) References Cited

U.S. PATENT DOCUMENTS

| | | | |
|---|---|---|---|
| 8,679,902 B1 | 3/2014 | Basker et al. | |
| 9,437,501 B1 | 9/2016 | Cheng et al. | |
| 2006/0240622 A1* | 10/2006 | Lee | H01L 29/42392 |
| | | | 438/257 |
| 2007/0108528 A1* | 5/2007 | Anderson | H01L 27/11 |
| | | | 257/365 |
| 2008/0135949 A1 | 6/2008 | Lo et al. | |
| 2016/0197004 A1* | 7/2016 | Akarvardar | H01L 21/76202 |
| | | | 257/509 |
| 2017/0005190 A1 | 1/2017 | Chang et al. | |
| 2017/0077232 A1 | 3/2017 | Balakrishnan et al. | |
| 2018/0175167 A1* | 6/2018 | Reboh | H01L 29/66553 |

OTHER PUBLICATIONS

Sachid et al., "Denser and More Stable SRAM Using FinFETs with Multiple Fin Heights", IEEE Transactions on Electron Devices, vol. 59, Issue 8, 2012, pp. 2037-2041.

Sacchetto et al., "Vertically-Stacked Gate-All-Around Polysilicon Nanowire FETs with Sub-μm Gates Patterned by Nanostencil Lithography", Microelectronic Engineering, vol. 98, 2012, pp. 355-358.

Vandervorst et al., "Fabrication of (Silicon)-Germanium on Insulator Substrates by the Germanium Condensation Technique", Katholieke Universiteit Leuven—Faculteit Wetenschap & Technologie, Arenbergkasteel, B-3001 Heverlee (Belgie), Apr. 2012, pp. 1-2 and 24-72.

Gaillardon et al., "Nanowire Systems: Technology and Design", Phil. Trans. R. Soc. A 372: 20130102. http://dx.doi.org/10.1098/rsta.2013.0102, 2014, pp. 1-15.

Zheng et al., "FinFET Evolution Toward Stacked-Nanowire FET for CMOS Technology Scaling", IEEE Transactions on Electron Devices, vol. 62, Issue 12, Dec. 2015, Abstract, pp. 1-4.

APA citation, "World's First Vertically Stacked Gate-All-Around Si Nanowire CMOS Transistors", Dec. 23, 2016, pp. 1-2. Retrieved Jun. 14, 2017 from https://phys.org/news/2016-12-world-vertically-stacked-gateall-around-si.html.

* cited by examiner

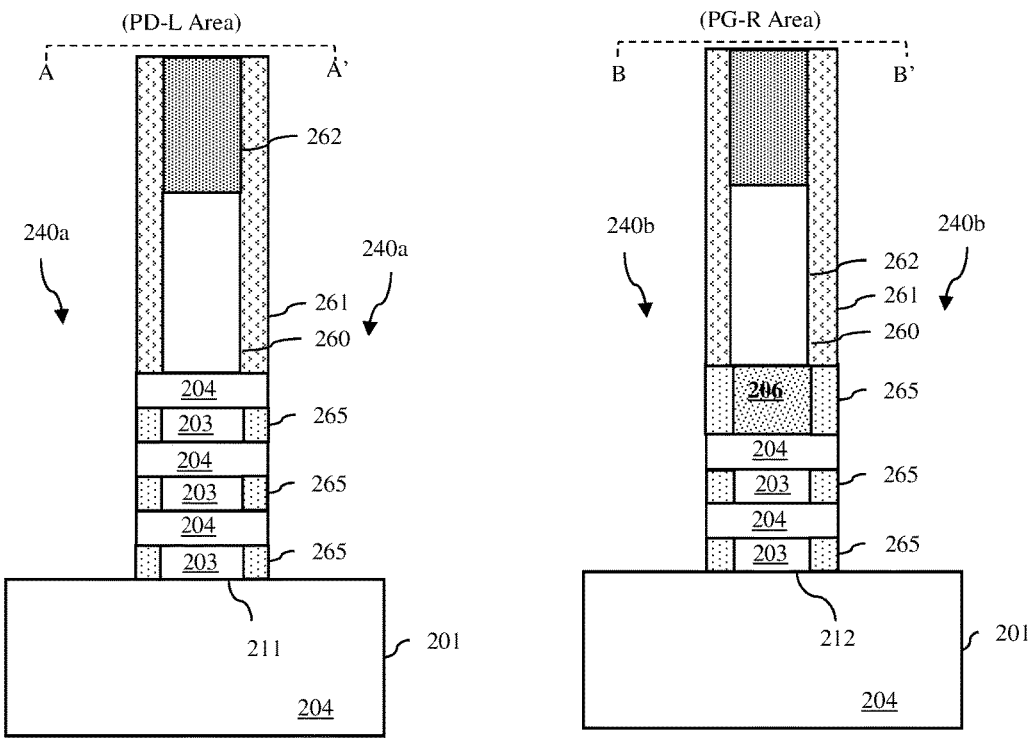
FIG. 10A
FIG. 10B
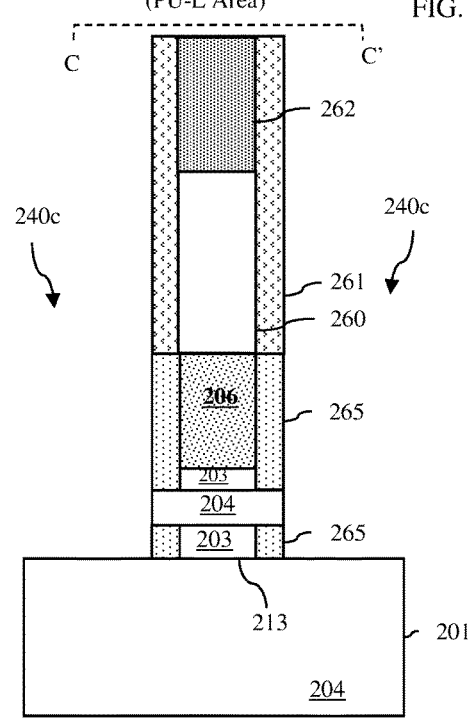
FIG. 10C

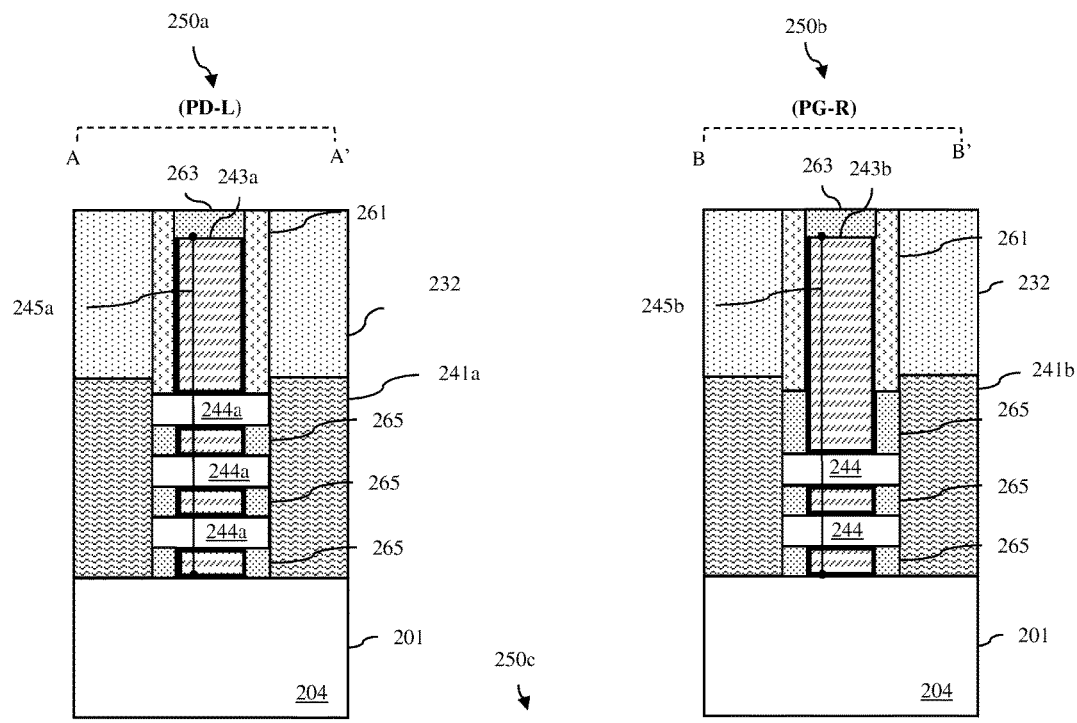
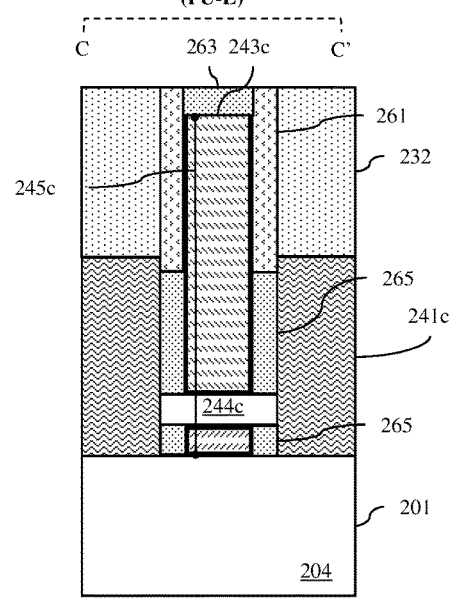
FIG. 14C
FIG. 14D
FIG. 14E

INTEGRATED CIRCUIT STRUCTURE INCORPORATING MULTIPLE GATE-ALL-AROUND FIELD EFFECT TRANSISTORS HAVING DIFFERENT DRIVE CURRENTS AND METHOD

BACKGROUND

Field of the Invention

The present invention relates to integrated circuit (IC) structures and, more particularly, to an IC structure that incorporates multiple gate-all-around field effect transistors (GAAFETs) having different drive currents and to a method of forming the IC structure.

Description of Related Art

Integrated circuit (IC) structures often incorporate multiple field effect transistors (FETs). For optimal circuit performance, some of the FETs on the same chip may require a higher drive current as compared to others. The different drive currents can be achieved by forming the different FETs so that they have different effective channel widths. However, depending upon the design of the FETs, the techniques used to form FETs with different effective channel widths will vary. For example, in planar single gate FETs, different channel widths can be achieved by using planar semiconductor bodies with different widths in the different FETs. In non-planar multi-gate FETs (MUGFETs), such as dual-gate FETs (also referred to herein as fin-type FETs (FINFETs)) or tri-gate FETs, different effective channel widths can be achieved by using different numbers of semiconductor fins within different FETs and/or by using semiconductor fins having different heights within the different FETs. Recently, gate-all-around field effect transistors (GAAFETs) have been developed and new techniques are now needed for forming different GAAFETs with different effective channel widths on the same substrate.

SUMMARY

In view of the foregoing, disclosed herein are embodiments of a method of forming an integrated circuit (IC) structure with gate-all-around field effect transistors (GAAFETs) having different drive currents. In the method, a multi-layer stack can be formed on a substrate. The substrate can be a first semiconductor material and the multi-layer stack can include alternating layers of a second and the first semiconductor material. One or more recesses, which are filled with sacrificial material, can be formed in one or more areas of the stack. Subsequently, the stack can be patterned into multi-layer fins and GAAFET processing can be performed. This GAAFET processing can include removal of sacrificial gates to form gate openings and removal of the second semiconductor material and any sacrificial material (if present) from the gate openings such that, within each gate opening, only nanoshape(s), which are made of the first semiconductor material and which extend laterally between source/drain regions, remain. Gate openings where sacrificial material was removed will have fewer nanoshapes than others and, thus, in the resulting IC structure, at least some of the GAAFETs will have fewer channel regions and, thereby lower drive currents than others.

More particularly, disclosed herein is an embodiment of a method of forming an integrated circuit (IC) structure with at least two gate-all-around field effect transistors (GAAF-ETs) having different drive currents. The method can include providing a substrate made of a first semiconductor material and then forming, on the substrate, a multi-layer stack that includes alternating layers of a second semiconductor material and the first semiconductor material. A recess filled with a sacrificial material can be formed in an area of the stack and the maximum depth of the recess can be at or above the top surface of the first layer of the first sacrificial material.

The multi-layer stack can then be patterned into multi-layer fins. The fins can include at least a first fin and a second fin. Specifically, this patterning process can be performed such that the first fin includes all of the same alternating layers present in the stack and further such that the second fin includes the sacrificial material above at least one layer of the first semiconductor material.

Transistors (e.g., GAAFETs) can subsequently be formed using these multi-layer fins. The GAAFETs can include: a first transistor, which has multiple first channel regions formed using multiple layers of the first semiconductor material in the first fin; and a second transistor, which includes at least one second channel region formed using the at least one layer of the first semiconductor material in the second fin. Since the second transistor has fewer channel regions than the first transistor, these two transistors will have different drive currents. That is, the first transistor will have a higher drive current than the second transistor.

Also disclosed herein is an embodiment of a method of forming an integrated circuit (IC) structure with at least three gate-all-around field effect transistors (GAAFETs) having different drive currents. The method can include providing a substrate made of a first semiconductor material and then forming, on the substrate, a multi-layer stack that includes alternating layers of a second semiconductor material and the first semiconductor material. Recesses filled with a sacrificial material can be formed in different areas of the stack and the maximum depths of at least two of the sacrificial material-filled recesses can vary. That is, at least two of the sacrificial material-filled recesses can extend to different depths within the multi-layer stack. For example, in one transistor area, no sacrificial material-filled recess is formed. In another transistor area, a sacrificial material-filled recess can be formed such that it extends into the stack to a first depth, which is above at least two layers of the first semiconductor material. In yet another transistor area, a sacrificial material-filled recess can be formed such that it extends into the stack to a second depth, which is greater than the first depth, which is above at least one layer of the first semiconductor material and, particularly, which is above fewer layers of the first semiconductor material than the first depth.

The multi-layer stack can then be patterned into multi-layer fins. The fins can include at least a first fin, a second fin and a third fin. Specifically, the patterning can be performed such that the first fin includes all the alternating layers. The patterning can further be performed such that the second fin includes the sacrificial material above at least two layers of the first semiconductor material and, particularly, such that the second fin has fewer layers of the first semiconductor material than the first fin. The patterning can further be performed such that the third fin includes the sacrificial material above at least one layer of the first semiconductor material and, particularly, such that the third fin has fewer layers of the first semiconductor material than the second fin.

Transistors (e.g., GAAFETs) can subsequently be formed using these multi-layer fins. The GAAFETs can include: a first transistor, which has multiple first channel regions formed using multiple layers of the first semiconductor material in the first fin; a second transistor, which includes at least two second channel region formed using the at least two layer of the first semiconductor material in the second fin; and a third transistor, which includes at least one channel region formed using the at least one layer of the first semiconductor material in the third fin. Since the third transistor has fewer channel regions than the second transistor and the second transistor has fewer channel regions than the first transistor, these three transistors will have different drive currents. That is, the first transistor will have a higher drive current than the second transistor and the second transistor will have a higher drive current than the third transistor.

Also disclosed herein are embodiments of an integrated circuit (IC) structure formed according to the above-described method. The IC structure can include a substrate and, on the substrate, multiple transistors (e.g., gate-all-around field effect transistors (GAAFETs)). Additionally, at least some of these multiple transistors can have different drive currents.

For example, the IC structure can include first transistor. The first transistor can include first source/drain regions on the substrate and first channel regions and, particularly, first nanoshapes, which extend laterally between the first source/drain regions. The first transistor can further include a first gate that wraps around the first nanoshapes.

The IC structure can also include a second transistor. The second transistor can include second source/drain regions on the substrate and one or more second channel regions and, particularly, one or more second nanoshapes, which extend laterally between the second source/drain regions. The second transistor can further include a second gate that wraps around the one or more second nanoshapes. While the second transistor may have multiple second channel regions, given the method embodiments described above, the second transistor will specifically have fewer channel regions than the first transistor and, thereby a lower drive current than the first transistor.

The IC structure can, optionally, include a third transistor. The third transistor can include third source/drain regions on the substrate and one or more third channel regions and, particularly, one or more third nanoshapes, which extend laterally between the third source/drain regions. The third transistor can further include a third gate that wraps around the one or more third nanoshapes. In this case, the second transistor will have multiple second channel regions, given the method embodiments described above, the third transistor will specifically have fewer channel regions than the second transistor. Since the third transistor has fewer channel regions than the second transistor, the third transistor will have a lower drive current than the second transistor.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 10A-10C are different cross-section diagrams illustrating a partially completed structures formed according to the flow diagram of FIG. 1;

FIG. 14A is a top view diagram and FIGS. 14B-14E are different cross-section diagrams illustrating an IC structure formed according to the flow diagram of FIG. 1.

DETAILED DESCRIPTION

Figure 1:
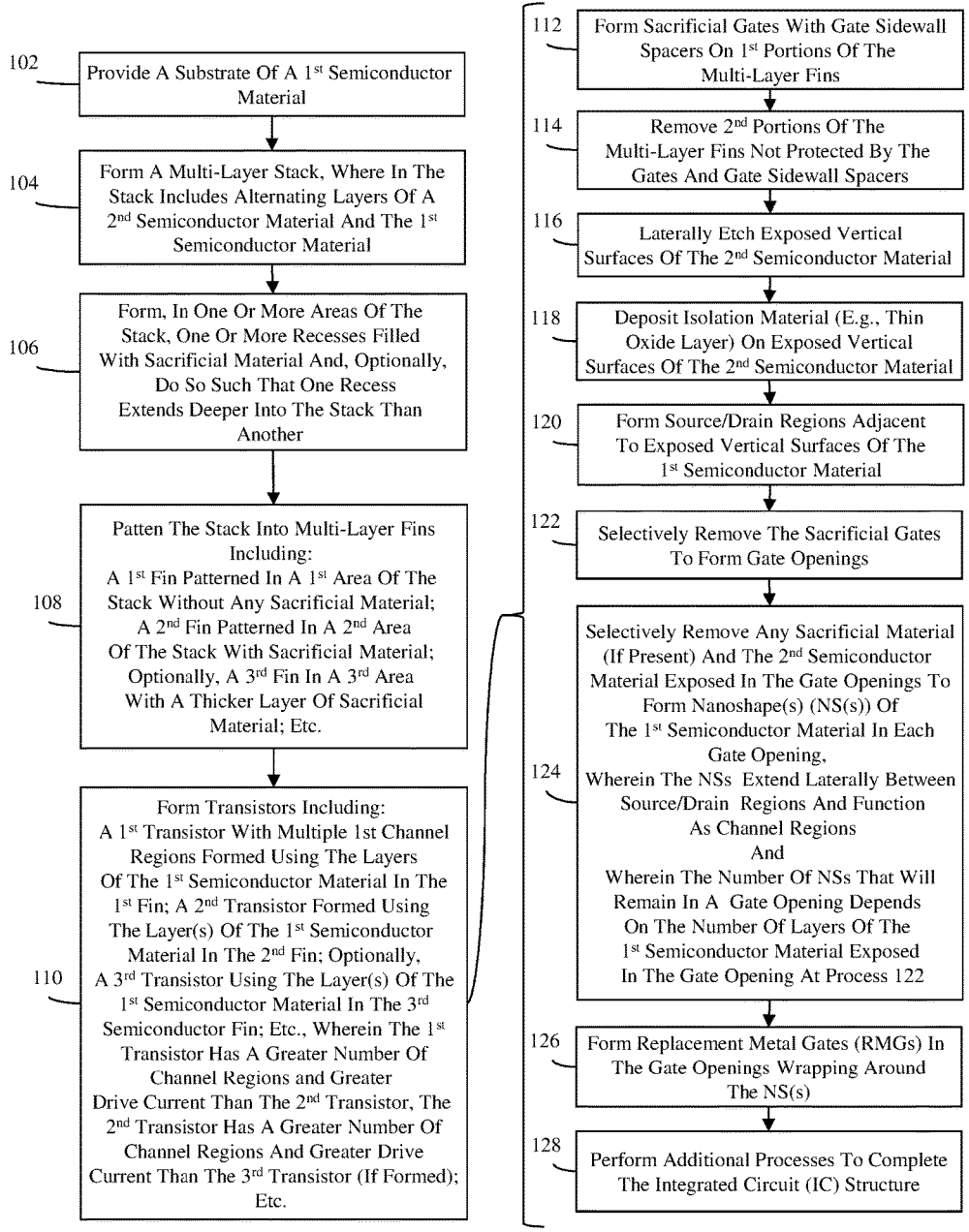
FIG. 1 is a flow diagram illustrating a method of forming an integrated circuit (IC) structure (e.g., a static random access memory (SRAM) cell) with two or more gate-all-around field effect transistors (GAAFETs) having different drive currents.

As mentioned above, integrated circuit (IC) structures often incorporate multiple field effect transistors (FETs). For optimal circuit performance, some of the FETs on the same chip may require a higher drive current as compared to others. The different drive currents can be achieved by forming the different FETs so that they have different effective channel widths. However, depending upon the design of the FETs, the techniques used to form FETs with different effective channel widths will vary. For example, in planar single gate FETs, different channel widths can be achieved by using planar semiconductor bodies with different widths in the different FETs. In non-planar multi-gate FETs (MUGFETs), such as dual-gate FETs (also referred to herein as fin-type FETs (FINFETs)) or tri-gate FETs, different effective channel widths can be achieved by using different numbers of semiconductor fins within different FETs and/or by using semiconductor fins having different heights within the different FETs.

Recently, gate-all-around field effect transistors (GAAFETs) (also referred to as nanoshape (NS) FETs) have been developed to improve drive current and electrostatics and allow for further device size scaling and techniques are now needed for forming different GAAFETs with different effective channel widths on the same chip. More specifically, a GAAFET, such as a nanowire-type FET or a nanosheet-type FET, includes one or more elongated nanoshapes as channel regions that extend laterally between source/drain regions and a gate structure that wraps around top, bottom and side surfaces of the nanoshape(s).

For purposes of this disclosure, an elongated nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). Nanoshapes include nanowires, nanosheets and nanofins. Specifically, a nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin.

GAAFETs are typically formed by forming a multi-layer stack on a substrate and then patterning the stack into multiple multi-layer fins, wherein each multi-layer fin has alternating layers of two different semiconductor materials. For each GAAFET, a sacrificial gate is formed over a multi-layer fin, source/drain regions are formed on opposing sides of the gate, and the sacrificial gate is removed, thereby forming a gate opening. A selective isotropic etch process is then performed to selectively remove one of the semiconductor materials from the gate opening such that only elongated nanoshape(s) of the other semiconductor layer remain. The elongated nanoshape(s) extend laterally between the source/drain regions and, in the case of multiple nanoshapes, they are physical separated from each other, parallel to each other, and stacked one above the other. A gate structure is then formed in the gate opening so that it wraps around the elongated nanoshape(s) and elongated nanoshape(s) function as channel region(s). These GAAFETs exhibit multi-dimensional field effects as compared to the two-dimensional field effects exhibited by FINFETs and, thus, they exhibit improved gate control over the channel region(s). However, since the number and dimensions of nanoshapes in a given GAAFET formed on a substrate depends upon the number of layers in and the width of the multi-layer fin used and since the multi-layer fins used form all GAAFETs are typically patterned from the same multi-layer stack, the GAAFETs will have the same effective channel width and, thereby the same drive current. Therefore, new techniques are now needed for forming different GAAFETs with different effective channel widths on the same substrate.

In view of the foregoing, disclosed herein are embodiments of a method of forming an integrated circuit (IC) structure with gate-all-around field effect transistors (GAAFETs) having different drive currents. In the method, a multi-layer stack can be formed on a substrate. The substrate can be a first semiconductor material and the multi-layer stack can include alternating layers of a second and the first semiconductor material. One or more recesses, which are filled with sacrificial material, can be formed in one or more areas of the stack. Subsequently, the stack can be patterned into multi-layer fins and GAAFET processing can be performed. This GAAFET processing can include removal of sacrificial gates to form gate openings and removal of the second semiconductor material and any sacrificial material (if present) from the gate openings such that, within each gate opening, only nanoshape(s), which are made of the first semiconductor material and which extend laterally between source/drain regions, remain. Gate openings where sacrificial material was removed will have fewer nanoshapes than others and, thus, in the resulting IC structure, at least some of the GAAFETs will have fewer channel regions and, thereby lower drive currents than others.

More particularly, referring to the flow diagram of FIG. 1, disclosed herein are embodiments of a method of forming an integrated circuit (IC) structure with two or more gate-all-around field effect transistors (GAAFETs) having different drive currents.

For purposes of illustration, the method is described in greater detail below with respect to an IC structure that includes a static random access memory (SRAM) array that includes six-transistor (6T) SRAM cells with transistors requiring different drive currents for optimal performance.

Figure 2A:
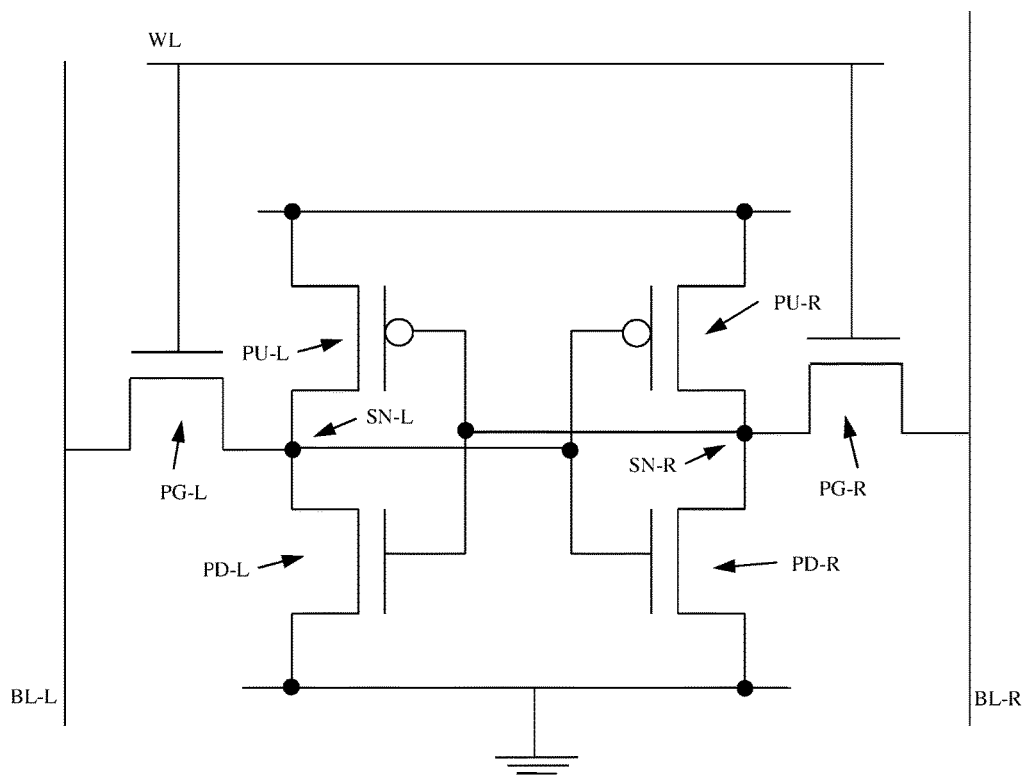
FIG. 2A is a schematic diagram of an exemplary six-transistor (6T) static random access memory (SRAM) cell and FIG. 2B is diagram showing an exemplary layout of FET areas for the SRAM cell.
Figure 2B:
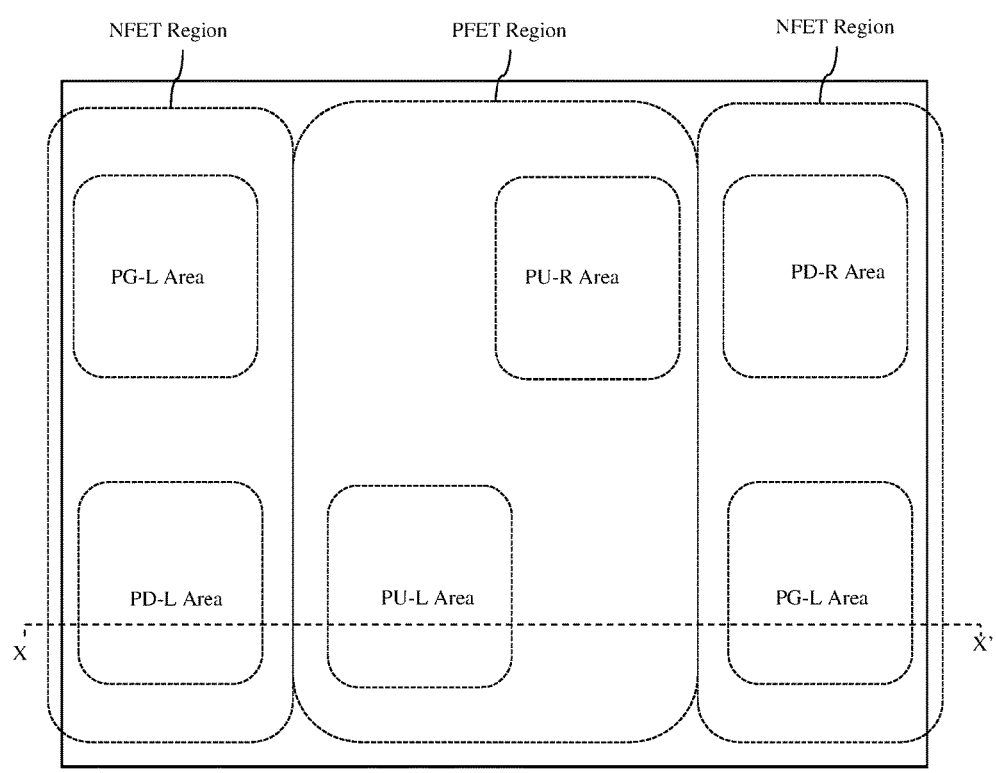

Specifically, FIG. 2A is a schematic diagram of an exemplary six-transistor (6T) static random access memory (SRAM) cell of an SRAM array. This SRAM cell includes a pair of access transistors (see left-side and right-side pass-gate transistors PG-L and PG-R), which are N-type field effect transistors (NFETs). The SRAM cell also includes a pair of cross-coupled inverters. A left-side inverter including a pull-up transistor PU-L (i.e., a P-type field effect transistor (PFET)) connected in series to a pull-down transistor PD-L (i.e., an NFET). The drain of PG-L is connected to a storage node SN-L between PU-L and PD-L and the drain PG-R is connected to a storage node SN-R between PU-R and PD-R. Furthermore, the source PG-L is connected to one bitline of a complementary pair of bitlines (see BT-L) and the source of the PG-R is connected to the other bitline in the complementary pair of bitlines (see BL-R). Finally, the gates of PG-L and PG-R are connected to a wordline (WL). FIG. 2B is a diagram showing an exemplary layout of FET areas for such an SRAM. Specifically, FIG. 2B shows a PFET Region positioned laterally between NFET Regions on a semiconductor substrate and further shows, for a 6T SRAM cell as shown in FIG. 2A, typical areas for placement of PU-L and PU-R in the PFET region placement, areas for placement of PG-L and PD-L in the left-side NFET region and areas for placement of PG-R and PD-R in the right-side NFET region.

SRAM cell operations include write operations, where a data value is stored in the cell, and read operations, where a stored data value is read from the cell. During a write operation, if a data value of "1" (i.e., a high data value) is to be written to the cell, a "1" is applied to BL-L and a "0" is applied to BL-R. Contrarily, if a data value of "0" (i.e., a low data value) is to be written to the cell, a "0" is applied to BL-L and a "1" is applied to BL-R. Then, the WL is activated to enable PG-L and PG-R and the data value is stored. For writability (i.e., for ensuring that a previously stored data value can be flipped), there is a strong correlation to the gamma ratio (i.e., the ratio between the on-current of the pass-gate FETs (Ion_PG) and the on-current of the pull-up FETs (Ion_PU)). During a reading operation, BL-L and BL-R are both pre-charged high (i.e., to a "1") and the WL is activated to enable the PG-L and PG-R. When a data value of "1" is stored in the cell, BL-L will remain charged at its pre-charge level of "1" and BL-R will be discharged to "0" through the right-side pass-gate and pull-down FETs. When a data value of "0" is stored in the cell, BL-L will be discharged to "0" through the left-side pass-gate and pull-down FETs and BL-R will remain charged at its pre-charge level of "1". A sense amplifier senses whether BL-L or BL-R is higher and, thereby senses the data value that is stored in the cell. For readability (i.e., for ensuring that a stored data value can be read), the voltage difference between BL-L and BL-R must be sufficiently large to allow a difference to be sensed and the cell needs to remain stable (i.e., needs to be able to retain a stored data value following a read operation). In this case, there is a strong correlation to the beta ratio (i.e., the ratio between the on-current of the pull-down FETs (Ion_PD) and the on-current of the pass-gate FETs (Ion_PG)). The two ratios (i.e., the gamma and beta ratios) present conflicting requirements for Ion_PG and the SRAM cell structure must be tuned to balance out these requirements in order to improve soft yield (i.e., to minimize soft errors or memory write or read fails).

The conflicting requirements of Ion-PG can, for example, be balanced out by designing the SRAM cell so that the pass-gate FETs have a lower drive current than the pull-up FET. SRAM performance can further be optimized by designing the SRAM cell so that the pull-up FETs have a lower drive current than the pass-gate FETs. Thus, the method disclosed herein can be used to form an SRAM cell with pull-down, pass-gate and pull-up GAAFETs having these different drive currents.

Figure 3:
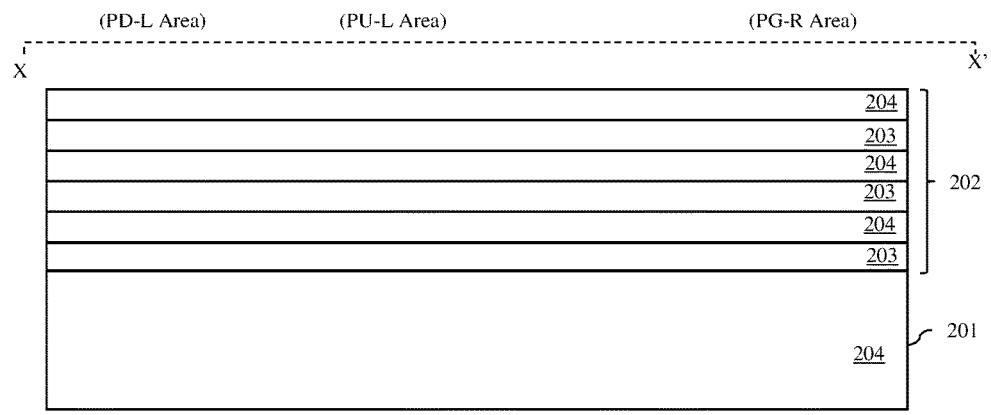
FIGS. 3-5 are cross-section diagrams illustrating partially completed structures formed according to the flow diagram of FIG. 1.
Figure 4:
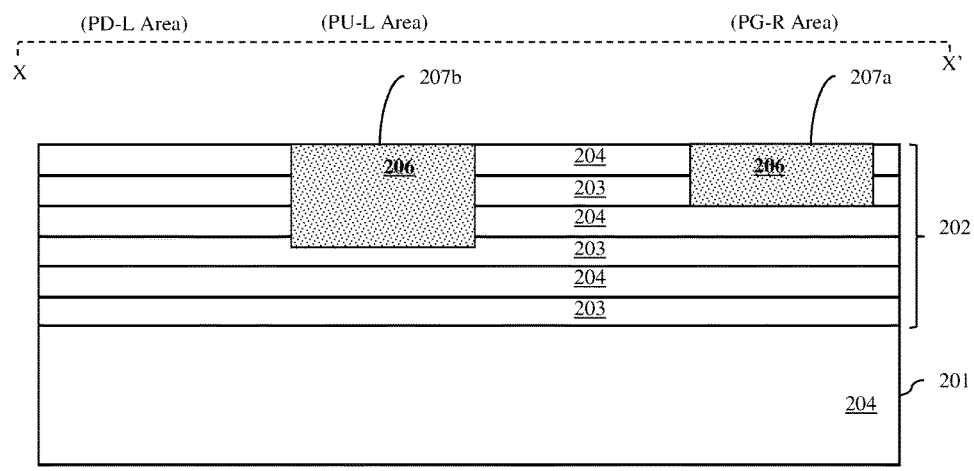

Referring again to the flow diagram of FIG. 1, the method can include providing a semiconductor substrate 201 (102, see FIG. 3). The semiconductor substrate 201 can, for example, be a bulk semiconductor substrate made of a first semiconductor material 204. This first semiconductor material 204 can be, for example, monocrystalline silicon.

The method can further include forming a multi-layer stack 202 on the substrate 201 (104, see FIG. 3). This multi-layer stack 202 can include alternating layers of a second semiconductor material 203 and the first semiconductor material 204. That is, an initial layer of the second semiconductor material 203 can be immediately adjacent to the top surface of the substrate 201, an initial layer of the first semiconductor material 204 can be on the initial layer of the second semiconductor material, another layer of the second semiconductor material 203 can be on the initial layer of the first semiconductor material 204, and so on. These alternating layers can be formed, for example, by epitaxial deposition such that the second semiconductor material 203 and the first semiconductor material 204 are different monocrystalline semiconductor materials. For example, as mentioned above, the first semiconductor material 204 can be monocrystalline silicon. The second semiconductor material 203 can be monocrystalline silicon germanium or any other suitable semiconductor material, which can be used to grow monocrystalline silicon and which can be selectively etched away from monocrystalline silicon during subsequent processing.

For purposes of illustration, the multi-layer stack 202 is shown in FIG. 3 as having six total layers including three layers of the second semiconductor material 203 and three layers of the first semiconductor material 204. However, it should be understood that the figures are not intended to be limiting and that, alternatively, the multi-layer stack could include a total of 4 or more alternating layers of the second semiconductor material and the first semiconductor material. Additionally, it should be noted that the thickness of each of the layers of the first semiconductor material 204 in the multi-layer stack should be equal to the desired height of elongated nanoshapes, which will form the channel regions in the resulting transistors. Furthermore, the thickness of each of the layers of the second semiconductor material 203 should be equal to the desired spacing between stacked elongated nanoshapes and, particularly, great enough to allow for gate material deposition between stacked elongated nanoshapes in the resulting transistors.

Subsequently, one or more recesses (e.g., see recesses 207a-207b) can be formed in different areas of the multi-layer stack 202 and filled with sacrificial material 206 (see process 106). Specifically, sacrificial material-filled recesses can be formed in areas where GAAFETs that have relatively low drive currents are to be formed (e.g., in PG-L, PG-R, PU-L and PU-R). Optionally, the depths of the recesses can vary to further adjust the drive currents. For example, consider a six-transistor SRAM, as shown in FIGS. 2A-2B, that includes pull-down transistors with a high drive current and pass-gate transistors and pull-up transistors with low drive currents, wherein, optionally, the pull-up transistors have an even lower drive current than the pass-gate transistors. In this case, no sacrificial material fill recesses would be formed in the PD-L and PD-R Areas. Thus, within these areas all of the layers in the multi-layer stack would remain intact following process 104. However, sacrificial material-filled recesses could be formed in the PU-L and PU-R Areas as well as in the PG-L and PG-R Areas. Thus, within these areas, fewer of the layers of the first semiconductor material 204 would remain intact following process 104. If, as mentioned above, the pull-up transistors are to have an even lower drive current then the pass-gate transistors, the sacrificial material-filled recesses can optionally be formed so that in the PG-L and PG-R Areas they extend a first depth into the multi-layer stack 202 (e.g., such that they are above at least two layers of the first semiconductor material 204, see recess 207a) and so that in the PU-L and PU-R Areas they extend into the multi-layer stack 202 to a second depth that is greater than the first depth (e.g., such that they are above at least one layer of the first semiconductor material 204 and, specifically, above fewer layers of the first semiconductor material 204 than the recesses in the PG-L and PG-R Areas, see recess 207b).

To form the sacrificial material-filled recesses, one or more first recesses having a first depth can be lithographically patterned, etched into the multi-layer stack 202, and then filled with sacrificial material 206. Filling the first recess(es) can be performed, for example, by epitaxial deposition or by any other suitable deposition technique. Once the first recess(es) are filled, a polishing process (e.g., a chemical-mechanical polishing (CMP) process) can be performed to remove any sacrificial material from above and outside the first recess(es). Optionally, one or more second recesses having a second depth, which is greater than the first depth, can be lithographically patterned, etched into the multi-layer stack 202, and also filled with the sacrificial material 206. Once the second recess(es) are filled, another polishing process (e.g., another CMP process) can be performed to remove any sacrificial material from above and outside the second recess(es).

The sacrificial material 206 can be the same material as the second semiconductor material 203 (e.g., monocrystalline silicon germanium). In this case, the sacrificial material 206 could be epitaxially grown within the recesses. Alternatively, the sacrificial material 206 can be different from the second semiconductor material 203. For example, the sacrificial material 206 could be polycrystalline silicon germanium or any other suitable sacrificial material, which is selected so that, during subsequent processing, it can be selectively etched over the first semiconductor material 204 and any adjacent dielectric materials and, preferably, so that the sacrificial material 206 and the second semiconductor material 203 can be selectively etched away from the first semiconductor material 204 (i.e., at the same time and using the same etch chemistry) during process 124 discussed in greater detail below.

Figure 5:
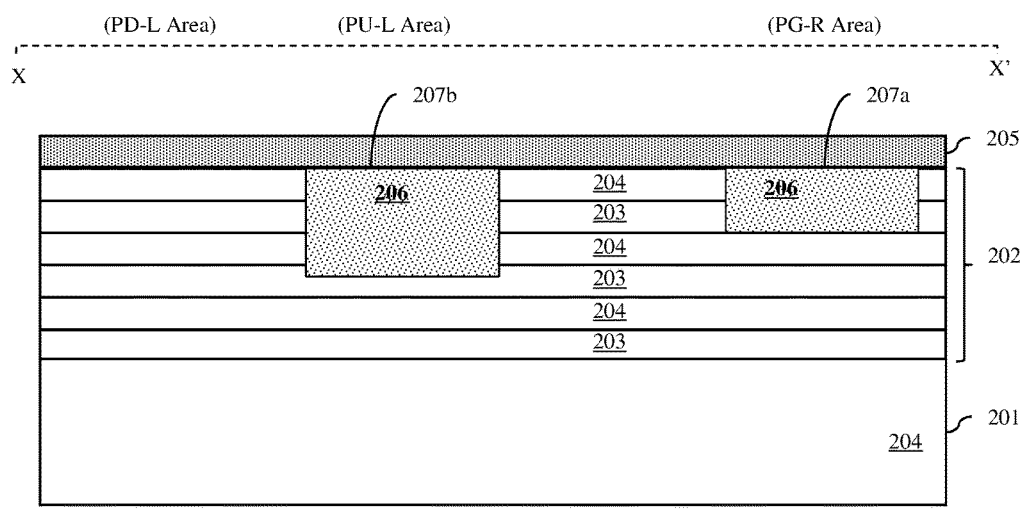

After the sacrificial material-filled recess(es) 207a-207b are formed, multi-layer fins can be formed from the multi-layer stack 202 (see process 108). For purposes of this disclosure, a "fin" refers to an elongated, relatively tall, essentially rectangular shaped-body. To form the multi-layer fins, a dielectric hardmask layer 205 (e.g., a silicon hardmask layer) can be deposited over the multi-layer stack 202 (see FIG. 5). The multi-layer stack 202 can then be patterned and etched into fins using conventional processing techniques (e.g., lithographic patterning and etch techniques, sidewall image transfer (SIT) techniques, etc.) (see FIGS. 6A-6B). Those skilled in the art will recognize that, while fins formed using such techniques may be essentially rectangular in shape, the sidewalls of the fins may not be perfectly perpendicular to the surface of the substrate (e.g., the sidewalls may taper) depending upon the etch specifications and materials used. In any case, the multi-layer fins should be patterned so as to have a width that is equal to the desired width for the elongated nanoshapes, which will form the channel region(s) in resulting transistors.

The multi-layer fins formed at process 108 can include at least a first fin 211, a second fin 212, a third fin 213, etc. Specifically, the patterning can be performed such that the first fin 211 (or at least a second thereof) includes all the alternating layers and such that the second fin 212 (or at least a section thereof) includes the sacrificial material 206 above at least one layer of the first semiconductor material 204 and, particularly, such the second fin 212 (or the section thereof) has fewer layers of the first semiconductor material 204 than the first fin 211. The patterning can further be performed such that a third fin 213 (or at least a section thereof) includes the sacrificial material 206 above at least one layer of the first semiconductor material 204 and, particularly, such that the third fin 213 has the same number or a lesser number of layers of the first semiconductor material 204 than the second fin 212; and so on.

Figure 6A:
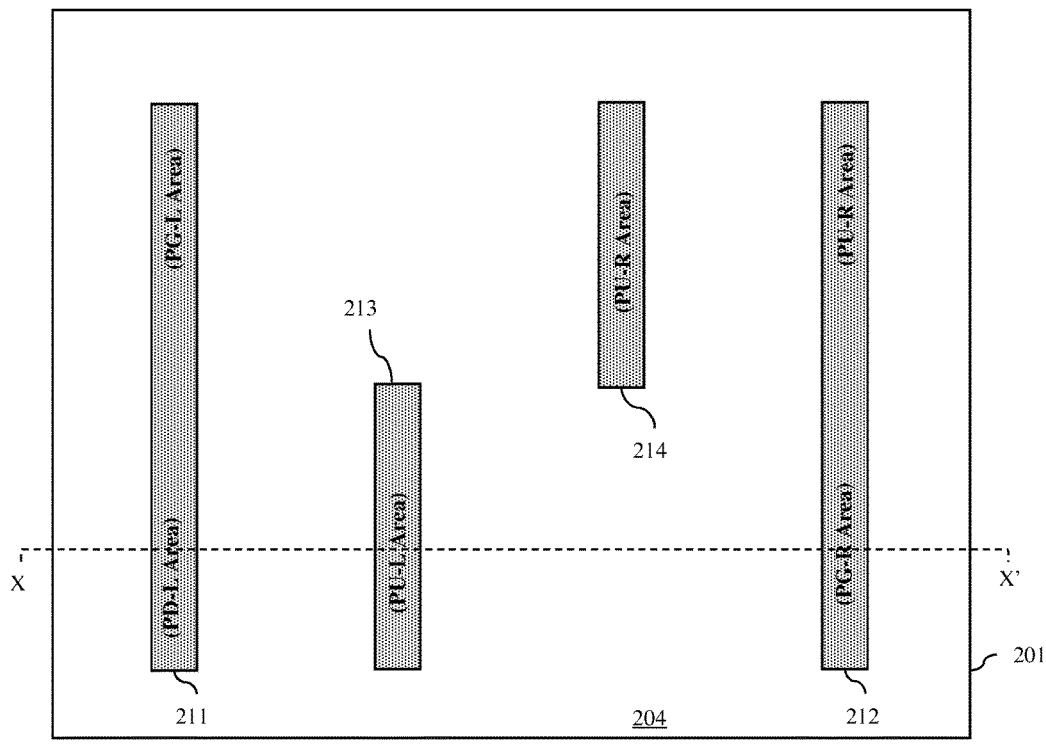
FIGS. 6A and 6B are top view and cross-section diagrams illustrating a partially completed structures formed according to the flow diagram of FIG. 1.
Figure 6B:
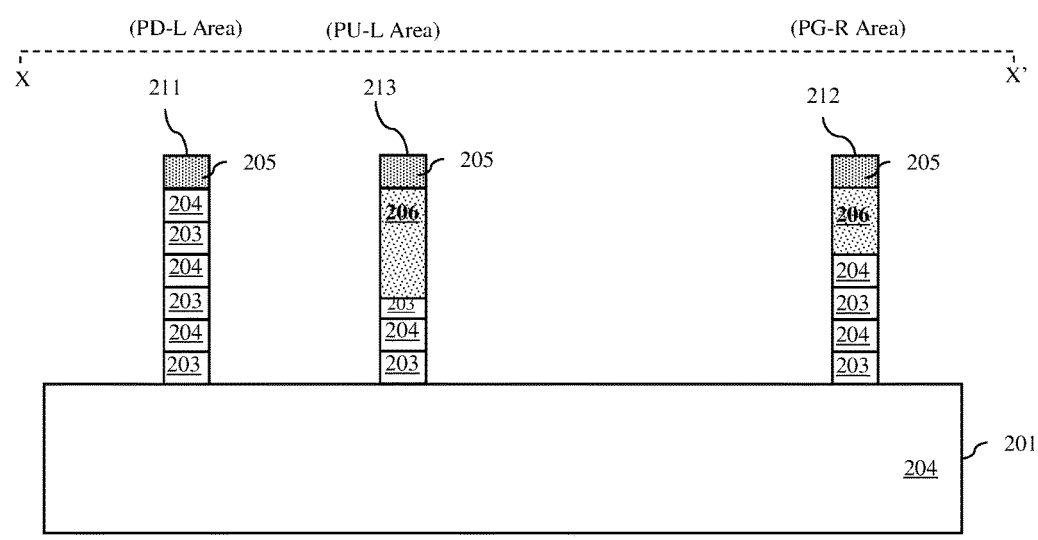

For example, FIG. 6A is a top view drawing illustrating the layout of four multi-layer fins 211-214, which have been patterned from a multi-layer stack 202 at process 108 for use in forming an SRAM cell. In this case, the first multi-layer fin 211 has two sections: a section in the PD-L Area (as shown in FIGS. 6A and 6B) such that it includes all the alternating layers of the second semiconductor material 203 and the first semiconductor material 204 and, particularly, such that it includes three layers of the first semiconductor material 204; and another section in the PG-L Area (as shown in FIG. 6A) such that it includes a relatively thin layer of the sacrificial material 206 above two layers of the first semiconductor material 204. The second multi-layer fin 212 similarly has two sections: a section in the PG-R Area (as shown in FIGS. 6A and 6B) such that it includes a relatively think layer of the sacrificial material 206 above two layers of the first semiconductor material 204; and another section in the PD-R Area (as shown in FIG. 6A) with three layers of the first semiconductor material. The third fin 213 is in the PU-L Area (as shown in FIGS. 6A and 6B) such that it includes a relatively thick layer of the sacrificial material 206 above one layer of the first semiconductor material 204. Additionally, a fourth fin 214 is in the PU-R Area (as shown in FIG. 6A) such that it, like the third fin 213, includes a relatively thick layer of the sacrificial material 206 above one layer of the first semiconductor material 204.

After the multi-layer fins are formed, transistors and, particularly, gate-all-around-field effect transistors (GAAFETs) can be formed using these multi-layer fins (see process 110). The GAAFETs can be formed so as to include: a first GAAFET, which includes multiple first nanoshapes formed using the multiple layers of the first semiconductor material 204 in the first fin 211; a second GAAFET, which includes one or more second nanoshapes formed using the one or more layers of the first semiconductor material 204 in the second fin 212 such that it has a lesser number of channel regions than the first GAAFET; and, optionally, a third GAAFET, which includes one or more first nanoshapes formed using the one or more layers of the first semiconductor material 204 in the third fin 213 such that it has the same number or a lesser number of channel regions than the second GAAFET. Since the second GAAFET has fewer channel regions than the first GAAFET, the second GAAFET will have a lower drive current than the first GAAFET. Additionally, if the third GAAFET has fewer channel regions than the second GAAFET, the third GAAFET will have a lower drive current than the second GAAFET. For a 6T SRAM, the method can be used to form two first transistors and, particularly, the two pull-down transistors PD-L and PD-R with a relatively high drive current; two second transistors and, particularly, the two pass-gate transistors PG-L and PG-R with a relatively low drive current; and two third transistors and, particularly, the two pull-up transistors PU-L and PU-R with the same drive current as the pass-gate transistors or an even lower drive current.

Exemplary processes that can be used to form these GAAFETs at process 110 are described below.

Figure 7A:
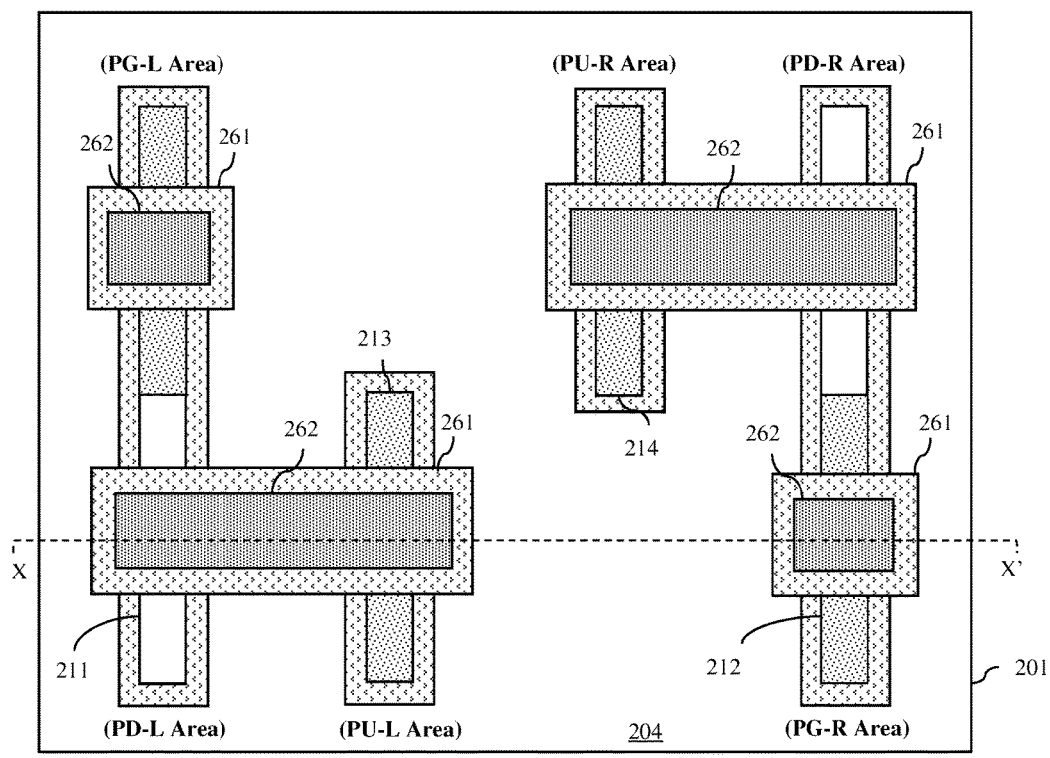
FIGS. 7A and 7B are top view and cross-section diagrams, respectively, illustrating a partially completed structures formed according to the flow diagram of FIG. 1.
Figure 7B:
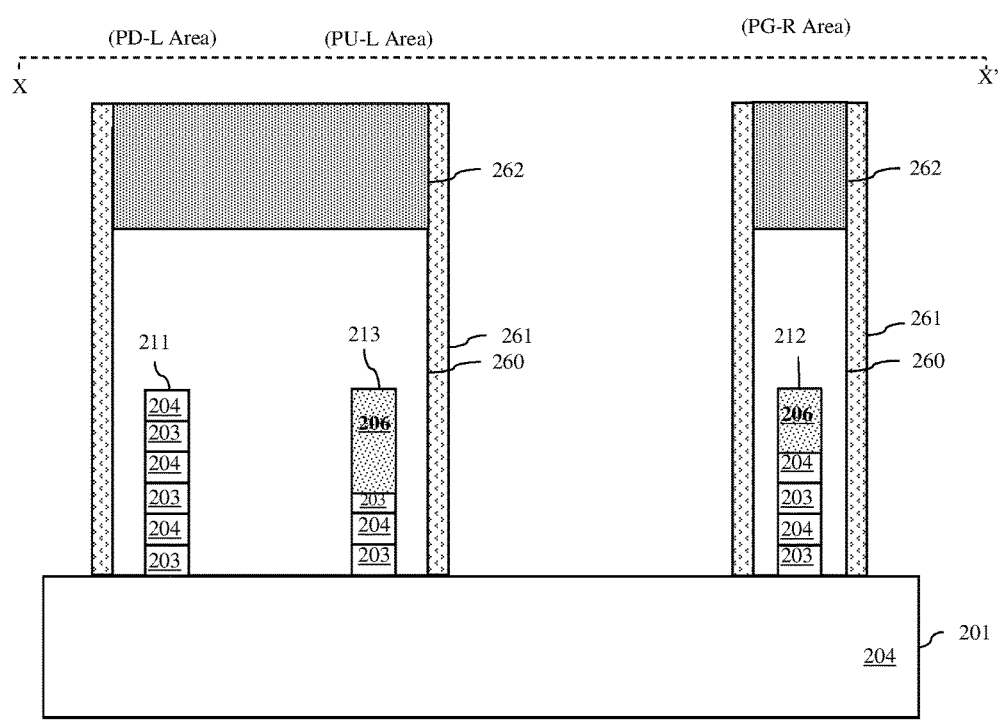

The remaining dielectric hardmask material 205 can be selectively removed from the tops of the fins 211-214. Then, sacrificial gates 260 with gate sidewall spacers 261 and sacrificial gate caps 262 can be formed on the multi-layer fins 211-214 (see process 112 and FIGS. 7A-7B). For example, a thin conformal dielectric layer (e.g., a thin silicon dioxide layer (not shown)) can be deposited over the multi-layer fins 211-214. Then, a blanket sacrificial gate layer can be deposited onto the conformal dielectric layer. This blanket sacrificial gate layer can be, for example, a polysilicon layer, an amorphous silicon layer or any other suitable sacrificial gate material that is different from the materials of the multi-layer fins (e.g., different from the first semiconductor material 204, the second semiconductor material 203, and the sacrificial material 206) and that can be selectively and isotropically etched away from the multi-layer fins during subsequent processing. The sacrificial gate layer can then be polished (e.g., using a CMP process) and a sacrificial dielectric cap layer (e.g., a silicon nitride cap layer) can be deposited onto the sacrificial gate layer. The resulting sacrificial gate stack can then be lithographically patterned and etched to form sacrificial gates 260, having sacrificial gate caps 262, on first portions of the multi-layer fins 211-214 within each of the different transistor areas (e.g., within the PD-L Area, the PU-L Area, the PG-R Area, the PG-L Area, the PU-R Area and the PD-R Area).

It should be noted that a discrete sacrificial gate could be formed in each transistor area. Alternatively, shared sacrificial gates could be formed across multiple transistor areas (e.g., see the shared sacrificial gate for PD-L and PU-L and the shared sacrificial gate for PD-R and PU-R in FIG. 7A). In any case, the sacrificial gates 260 will be patterned and etched such that they are essentially perpendicular to the multi-layer fins 211-214 and further such that the sacrificial gate materials are positioned adjacent to the top surface and the opposing sides of the first portions of the multi-layer fins 211-214.

Gate sidewall spacers 261 can then be formed on the sidewalls of the sacrificial gates 260 using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacers 261 can be made of silicon nitride, silicon silicon carbon nitride, silicon boron carbon nitride or any other suitable sidewall spacer material that is different from the material used for the sacrificial gate 260. Thus, after sacrificial gate and sidewall spacer formation, first portions of the multi-layer fins 211-214 in the transistor areas will be covered by sacrificial gates 260 with the gate sidewall spacers 261 and second portions of the multi-layer fins 211-214 in those same areas will extend laterally beyond the sacrificial gates 260 and gate sidewall spacers 261 (i.e., second portions of the multi-layer fins on either side of each sacrificial gate will remain exposed).

Figure 8A:
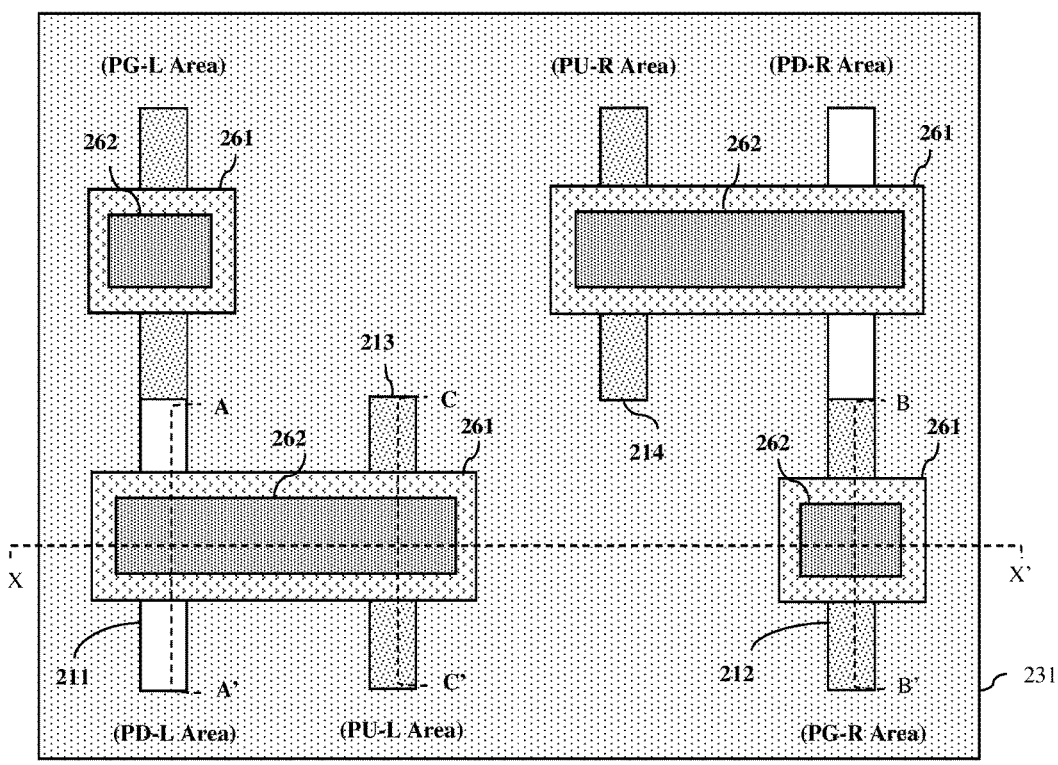
FIGS. 8A and 8B are top view and cross-section diagrams, respectively, illustrating a partially completed structures formed according to the flow diagram of FIG. 1.
Figure 8B:
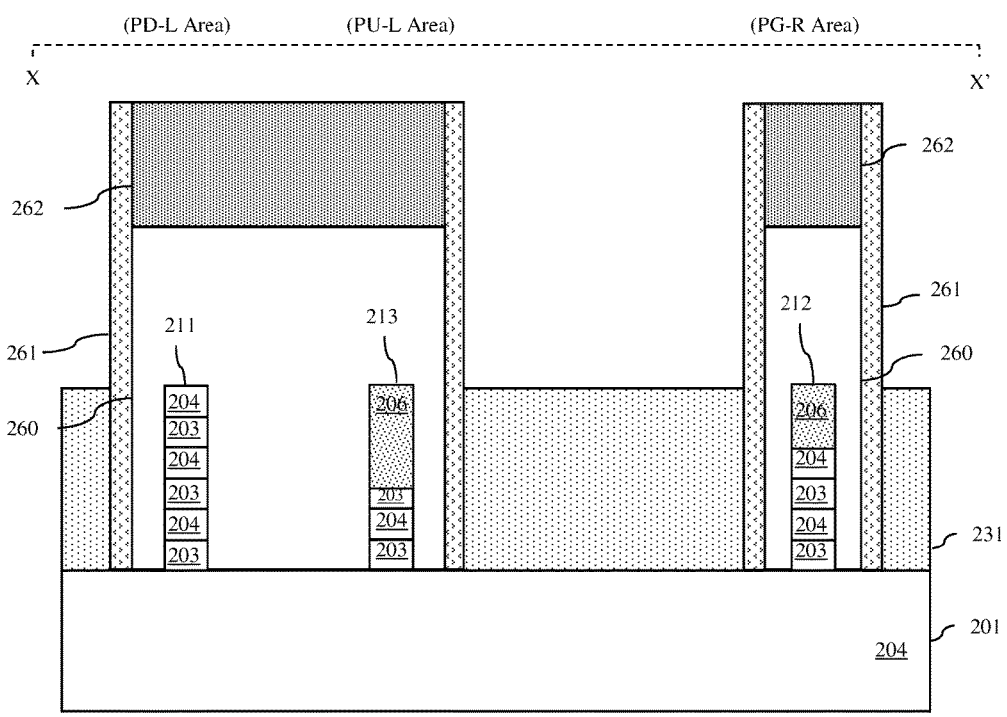
Figure 9A:
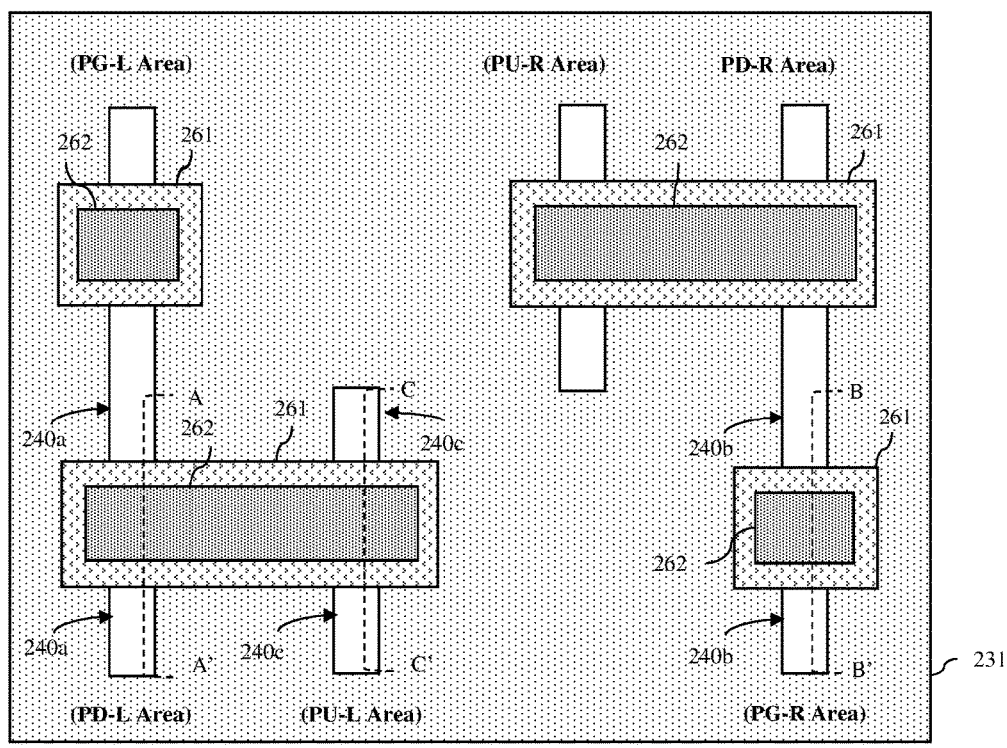
FIG. 9A is a top view diagram and FIGS. 9B-9D are different cross-section diagrams illustrating a partially completed structures formed according to the flow diagram of FIG. 1.
Figures 9B, 9C:
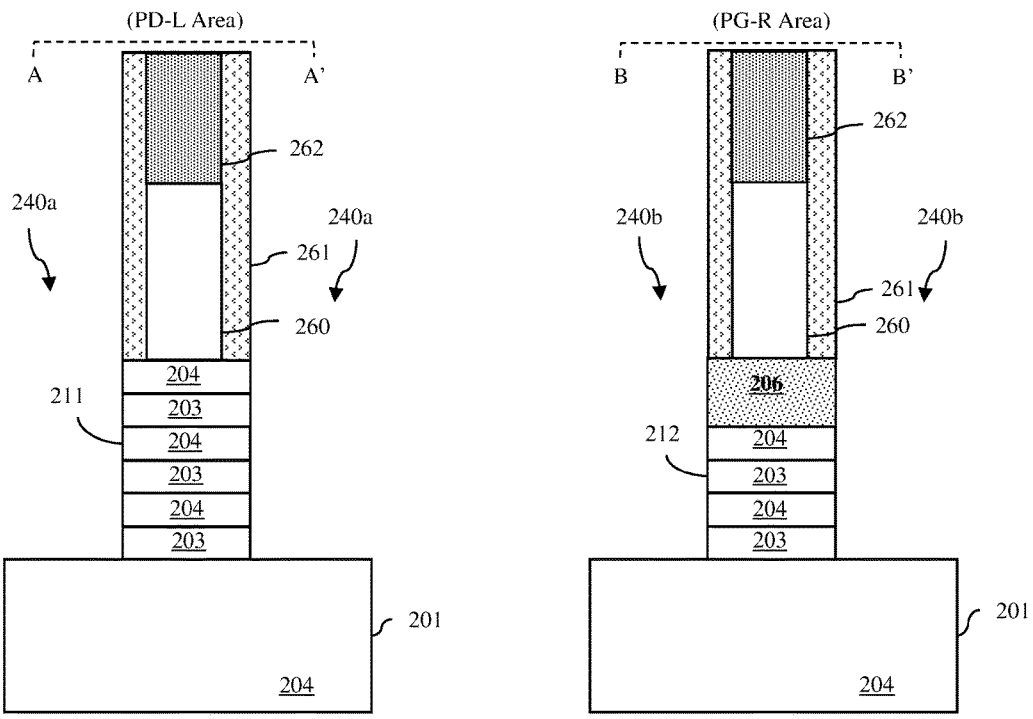
Figure 9D:
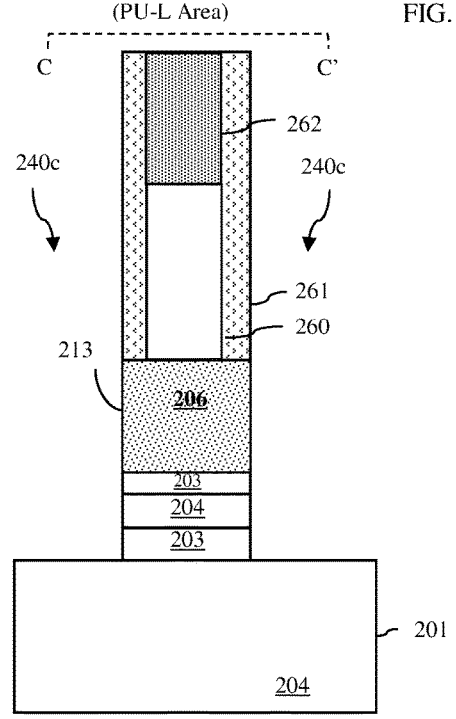

A dielectric layer 231 (e.g., a silicon dioxide layer) can be deposited and then recessed to expose the tops of the second portions of the multi-layer fins 211-214 (i.e., the portions of the multi-layer fins 211-214) (see FIGS. 8A and 8B). Then, the exposed second portions of the multi-layer fins 211-214 can be selectively removed (see process 114 and FIGS. 9A and 9B). Specifically, an anisotropic etch process can be performed, wherein the etch chemistries used are selective for the materials of the multi-layer fins (e.g., for the sacrificial material 206, the first semiconductor material 204 and the second semiconductor material 203) over the adjacent dielectric materials of the dielectric layer 231, the gate sidewall spacers 261 and the sacrificial gate caps 262. The resulting partially completed structure will, thus, include source/drain openings for each of the GAAFETS on opposing sides of the sacrificial gates in each of the transistor areas. For example, see first source/drain openings 240*a* for a first transistor (a pull-down transistor) on opposite sides of a sacrificial gate 260 in the PD-L Area (as illustrated in FIGS. 9A and 9B); see the second source/drain openings 240*b* for a second transistor (a pass-gate transistor) on opposite sides of a sacrificial gate in the PG-R Area (see FIGS. 9A and 9C); see third source/drain openings 240*c* for a third transistor (a pull-up transistor) on opposite sides of the sacrificial gate in the PU-L Area (see FIGS. 9A and 9D); and so on.

After the source/drain openings are formed, exposed vertical surfaces of the second semiconductor material 203 in the remaining portions of the multi-layer fins below the gate sidewall spacers 261 can be laterally etched to form shallow cavities that undercut the first semiconductor material 204 and these shallow cavities can be filled with an isolation material, thereby forming isolation regions 265 (see processes 116-118 and FIGS. 10A-10C). That is, an isotropic etch process that is selective for the second semiconductor material 203 over the first semiconductor material 204 can be performed to etch back the exposed vertical surfaces of the second semiconductor material 203 only, thereby creating the shallow cavities. To form isolation regions 265 in the cavities, a blanket layer of isolation material (e.g., silicon dioxide, silicon nitride, etc.) could be deposited, filling the cavities and adjacent areas. Then, an anisotropic etch process could be performed, using the sacrificial gates 260 and gate sidewall spacers 261 as a mask, such that any isolation material outside the cavities is removed. Alternatively, to form isolation regions 265 in the cavities, an oxidation process could be performed resulting in the formation of a first oxide material (e.g., silicon dioxide) on the exposed surfaces of the first semiconductor material 204 and a second oxide material that is different from the first oxide material (e.g., silicon germanium oxide) on the exposed surfaces of the second semiconductor material 203 (i.e., within the cavities). Then, the first oxide material can be selectively etched over the second oxide material to expose surfaces of the first semiconductor material 204 without exposing surfaces of the second semiconductor material 203. For example, a remote plasma-based ammonium fluoride ($NH_4F$) etch process, such as a SiConi™ process, could be used to selectively etch silicon dioxide over silicon germanium oxide (i.e., to etch silicon dioxide at a significantly faster rate than silicon germanium oxide. Alternatively, any other suitable technique to form the isolation regions 265.

Figure 11A:
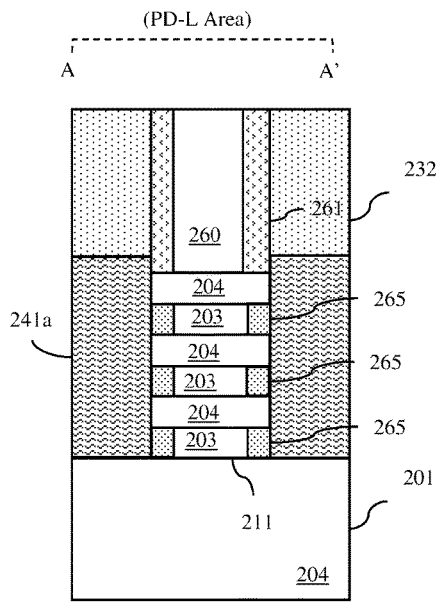
FIGS. 11A-11C are different cross-section diagrams illustrating a partially completed structures formed according to the flow diagram of FIG. 1.
Figure 11B:
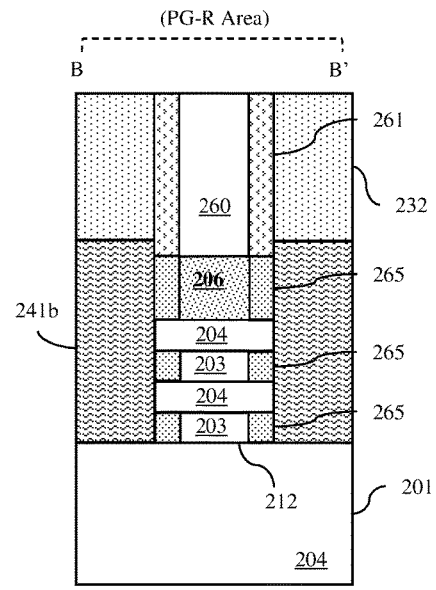
Figure 11C:
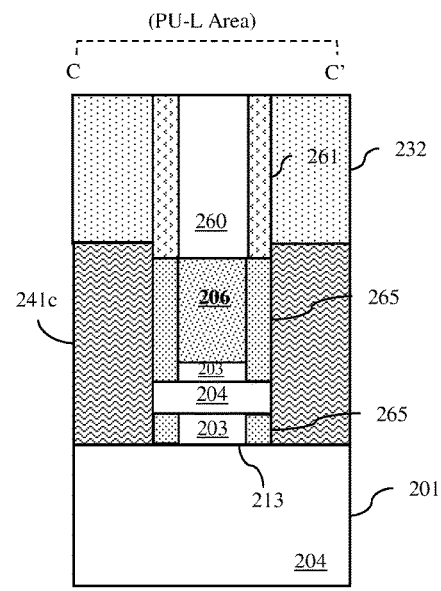

Source/drain regions for the GAAFETs can then be formed in the source/drain openings and, particularly, formed such that they are positioned laterally immediately adjacent to the exposed vertical surfaces of the first semiconductor material 204 (see process 120 and FIGS. 11A-11C). For example, first source/drain regions 241*a* for a first transistor (a pull-down transistor) can be formed immediately adjacent to exposed surfaces of the first semiconductor material 204 in the remaining portion of the first fin 211 in the PD-L Area (see FIG. 11A); second source/drain regions 241*b* for a second transistor (a pass-gate transistor) can be formed immediately adjacent to exposed surfaces of the first semiconductor material 204 in the remaining portion of the second fin 212 in the PG-R Area (see FIG. 11B); third source/drain regions 241*c* for a third transistor (a pull-up transistor) can be formed immediately adjacent to exposed surfaces of the first semiconductor material 204 in the remaining portion of the third fin 213 in the PU-L Area (see FIG. 11C); and so on. These source/drain regions can be formed, for example, by epitaxial deposition of in situ-doped semiconductor material (e.g., on the exposed surfaces of the first semiconductor material 204).

As discussed above, in an SRAM cell, the pull-down and pass-gate transistors are N-type field effect transistors (NFETs) and the pull-up transistors are P-type field effect transistors (PFETs). In this case, it should be understood that the source/drain openings for the PFETs would be masked, during epitaxial deposition of the in situ-doped semiconductor material for the NFETs, and vice versa. Furthermore, it should be noted that the semiconductor material deposited for the source/drain regions of the PFETs could be the same semiconductor material as that deposited for the source/drain regions of the NFETs. Alternatively, the semiconductor material deposited for the source/drain regions of the PFETs and for the source/drain regions of the NFETs could be different semiconductor materials, which are preselected to enhance charge carrier mobility.

After the source/drain regions are formed, a blanket dielectric fill layer 232 (e.g., a blanket silicon dioxide layer) can be deposited and a polishing process (e.g., a CMP process) can be performed in order to expose the tops of the sacrificial gates 260 (i.e., in order to remove the sacrificial gate caps 262).

Figure 12A:
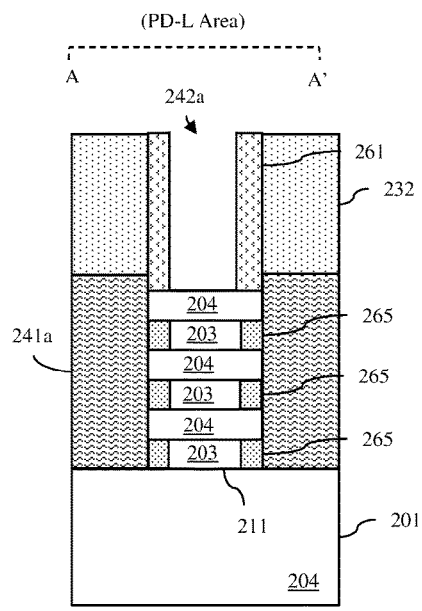
FIGS. 12A-12C are different cross-section diagrams illustrating a partially completed structures formed according to the flow diagram of FIG. 1.
Figure 12B:
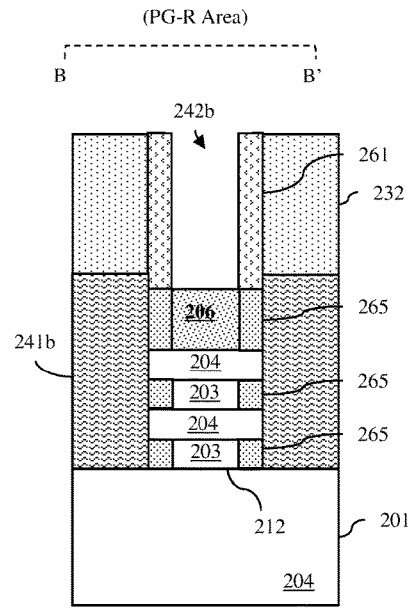
Figure 12C:
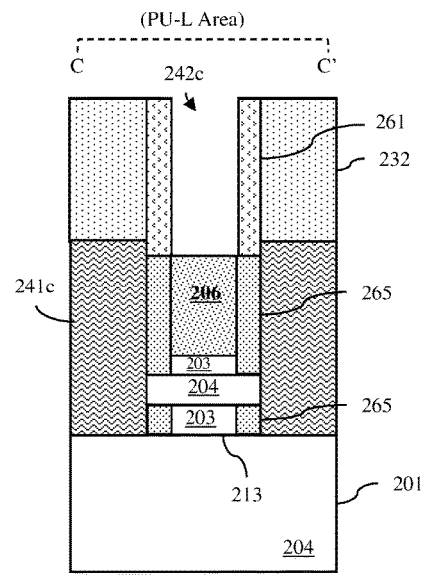

Next, the sacrificial gates 260 can be selectively removed, thereby creating gate openings (see process 122 and FIGS. 12A-12C). That is, a selective etch process can be performed to selectively etch away the material of the sacrificial gate layer over the materials of the multi-layer fins 211-214 (i.e., over the first semiconductor material 204, the second semiconductor material 203 and the sacrificial material 206) and also over the dielectric materials of the gate sidewall spacers 261 and the dielectric layer 232, thereby creating gate openings that expose the remaining portions of the multi-layer fins 211-214. As mentioned above, formation of the sacrificial gates 260 typically includes deposition of a thin conformal dielectric layer (e.g., a thin conformal silicon dioxide layer) prior to deposition and patterning of the sacrificial gate material. This thin conformal dielectric layer will protect the semiconductor material of the multi-layer fins during removal of the sacrificial gates 260. Following removal of the sacrificial gates 260, this conformal dielectric layer can also be removed from the gate opening (e.g., by buffered hydrofluoric acid (BHF) in the case of a silicon dioxide layer).

Specifically, the selective removal of the sacrificial gates 260 (and the conformal dielectric layer) can create a first gate opening 242a for a first transistor (a pull-down transistor) in the PD-L Area (see FIG. 12A), a second gate opening 242b for a second transistor (a pass-gate transistor) in the PG-R Area (see FIG. 12B), a third gate opening 242c for a third transistor (a pull-up transistor) in the PU-L Area (see FIG. 12C), and so on. As illustrated, the remaining portion of the first multi-layer fin 211, which is exposed in the first gate opening 242a in the PU-L Area, includes all the alternating layers of the second semiconductor material 203 and the first semiconductor material 204 that were originally present in the multi-layer stack 202; the remaining portion of the second multi-layer fin 212, which is exposed in the second gate opening 242b in the PG-R Area, includes a relatively thin layer of the sacrificial material 206 above at least two layers of the first semiconductor material 204; the remaining portion of the third fin 213, which is exposed in the third gate opening 242c in the PU-L Area, includes a relatively thick layer of the sacrificial material 206 above at least one layer of the first semiconductor material 204 (but less layers of the first semiconductor material 204 than in the PG-R area); and so on.

Figure 13A:
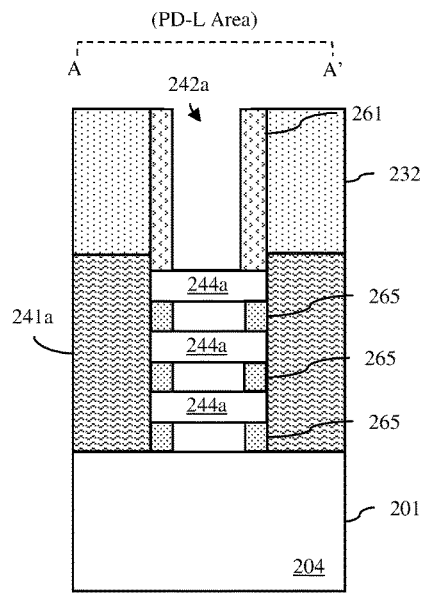
FIGS. 13A-13C are different cross-section diagrams illustrating a partially completed structures formed according to the flow diagram of FIG. 1.
Figure 13B:
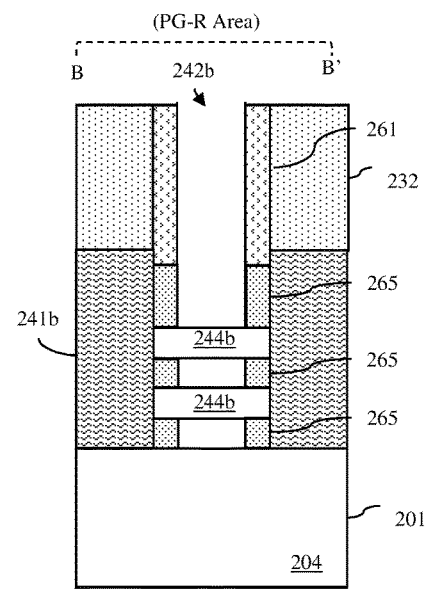
Figure 13C:
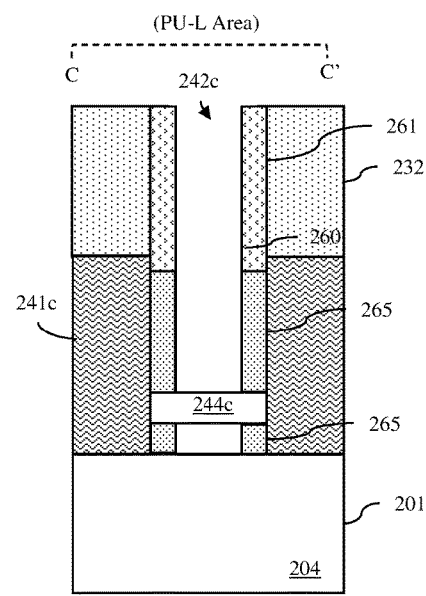
Figure 14A:
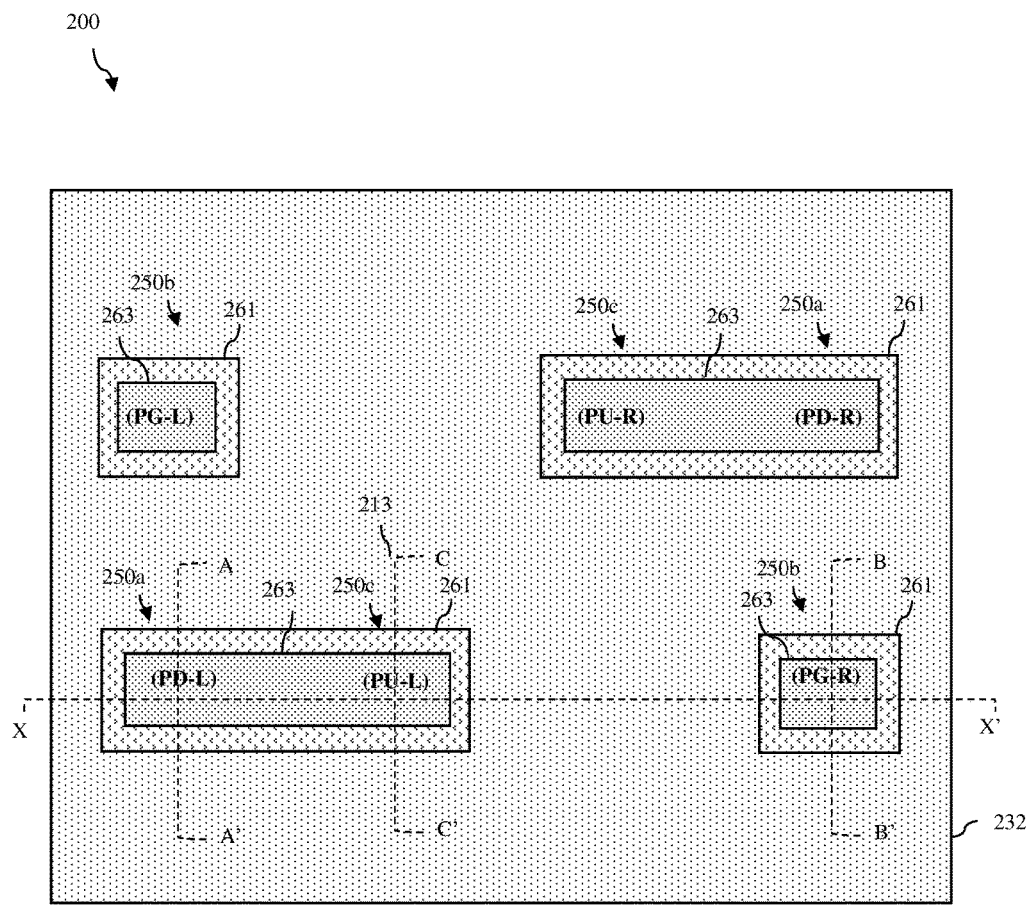
Figure 14B:
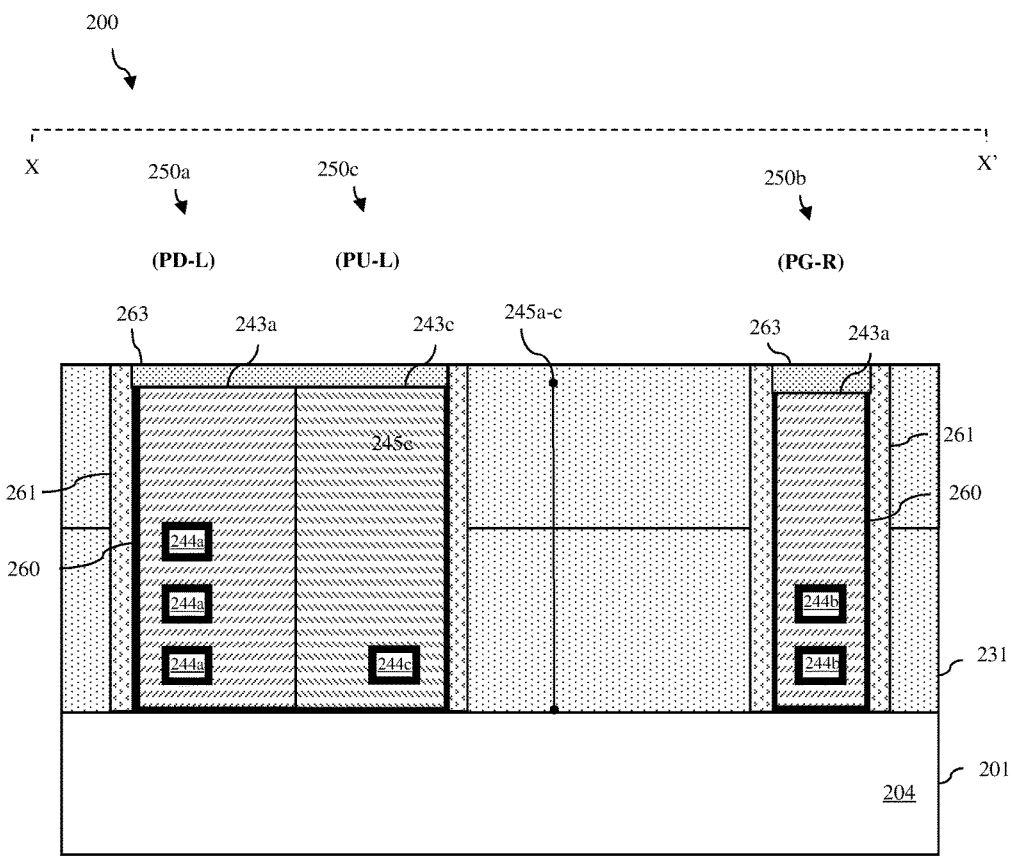

Once the gate openings are formed, the second semiconductor material 203 and any of the sacrificial material 206 that is exposed within the gate openings can be selectively etched away (see process 124 and FIGS. 13A-13C). For example, if the first semiconductor material 204 is silicon and the sacrificial material 206 and the second semiconductor material 203 are both silicon germanium (regardless of the crystalline structure), the silicon germanium can be selectively etched over the silicon as well as the dielectric materials of the gate sidewall spacers 261 and the dielectric layer 232 using any of the following exemplary processes: a thermal etch process (e.g., using gaseous hydrochloric acid (HCl)), a dry plasma etch process, or a wet etch process with process specifications designed to ensure the selective etch of silicon germanium over silicon and various dielectric materials. Alternatively, any other suitable isotropic selective etch process that selectively etches silicon germanium could be used.

As a result of process 124, discrete elongated nanoshapes of the first semiconductor material 204 (e.g., silicon nanoshapes) will extend laterally between sources/drain regions. The size of each of the gate openings will be essentially the same, but the number of nanoshapes within a given gate opening will correspond to the number of layers of the first semiconductor material 204 that were exposed within that given gate opening at process 122. For example, if the first gate opening 242a exposed three layers of the first semiconductor material 204 at process 122, then following process 124 that first gate opening 242a would contain three first nanoshapes 244a that extend laterally between the first source/drain regions 241a, as illustrated. If the second gate opening 242b exposed only two layers of the first semiconductor material 204 at process 122, then following process 124 that second gate opening 242b would contain two second nanoshapes 244b that extend laterally between the second source/drain regions 241b, as illustrated. If the third gate opening 242c exposed only one layer of the first semiconductor material 204 at process 122, then following process 124, that third gate opening 242c would contain one third nanoshape 244c that extends laterally between the third source/drain regions 241c, as illustrated; and so on. The lowest nanoshape in any gate opening will be physically separated from and parallel to the top surface of the substrate by a space and any additional nanoshapes will be stacked one above the other and also separated by spaces.

Replacement metal gates (RMGs) can then be formed in the gate openings (see process 126 and FIGS. 14A-14E). That is, a first RMG 243a can be formed in the first gate opening 242a so as to wrap around the first nanoshapes 244a, which will function as the first channel regions of a first transistor 250a (a pull-down transistor (PU-L) in a 6T SRAM); a second RMG 243b can be formed in the second gate opening 242b so as to wrap around the second nanoshapes 244b, which will function as the second channel regions of a second transistor 250b (a pass-gate transistor (PG-R) in a 6T SRAM); a third RMG 243c can be formed in the third gate opening 242c so as to wrap around the third nanoshape 244c, which will function as the third channel region of a third transistor 250c (a pull-up transistor (PU-L) in a 6T SRAM); and so on.

These RMGs can be formed using conventional RMG formation techniques. That is, a gate dielectric layer (e.g., a high-K gate dielectric layer) can be conformally deposited so that the exposed surfaces of the nanoshape(s) within gate openings are covered (i.e., so that the gate dielectric layer wraps completely around each nanoshape within each gate opening). Those skilled in the art will recognize that, due to the conformal deposition process, the gate dielectric layer may also cover other exposed surfaces within the gate opening (e.g., exposed surfaces of gate sidewall spacers 261 and the semiconductor substrate 201). A work function metal layer can be conformally deposited in the gate openings so as to cover the gate dielectric layer on each nanowire channel region. The metal material or metal alloy material of the conformal work function metal layer can be preselected in order to achieve the optimal gate conductor work function given the conductivity type of the transistors for which the RMGs are being formed. The work function metal layer can then, optionally, be chamfered. The chamfering process can include: depositing a protective fill material onto the work function metal layer; recessing the protective fill material; etching away the exposed work function metal material from above the protective fill material such that the maximum height of the work function metal layer is below the level of the top surface of the gate sidewall spacer; and removing the protective fill material. Finally, a conductive fill material can be deposited to fill any remaining space in the gate opening and a polishing process (e.g., a CMP process) can be performed to remove any RMG materials from above the top surface of the dielectric layer 232.

As discussed above, in an SRAM cell, the pull-down and pass-gate transistors are N-type field effect transistors (NFETs) and the pull-up transistors are P-type field effect transistors (PFETs). Those skilled in the art will recognize that, in this case, the gate openings for the PFETs would be masked, during RMG formation for the NFETs, and vice versa. Furthermore, in the cases where a shared gate opening for an NFET and a PFET was created by removal of a shared sacrificial gate (e.g., see the shared gate opening created by removal of the shared sacrificial gate for PD-L and PU-L and the shared gate opening created by removal of the shared sacrificial gate for PD-R and PU-R) various masked deposition and etch process steps can performed to ensure that, within that shared gate opening, a first work function layer is adjacent nanoshapes for the NFET and a second work function metal layer is adjacent to the nanoshape(s) for the PFET. Since various RMG structures and the methods of making them are well known in the art and could be incorporated into the transistors formed according to the disclosed method, only the RMGs 243a-243c, as a whole, are identified and illustrated in FIGS. 14A-14E. In order to avoid clutter in the drawings and allow the reader to focus on the salient aspects of the disclosed method, the individual components of the RMGs 243a-243c, including the gate dielectric layer, the work function metal layer, the conductive fill material, etc., are not specifically identified or illustrated.

Next, dielectric gate caps 263 can be formed on the top surfaces of the RMGs. For example, the conductive fill material within the gate openings can be recessed (i.e., etched back) and a dielectric cap layer (e.g., a silicon nitride cap layer) can be deposited over the partially completed structure. A polishing process (e.g., a CMP process) can be performed so as to remove any of the dielectric cap material from above the top surface of the dielectric layer 232, thereby forming the dielectric gate caps 263.

Thus, as illustrated in FIGS. 14B-14E, in the resulting IC structure, the lowest nanoshape (i.e., the lowest channel region or, more particularly, the channel region closest to the substrate 204) in each transistor (see transistors 250a-250c) will be at the same level; the next lowest nanoshape in each transistor, if any (see transistors 250a-250b) will be at the same level but at a higher level than the lowest channel region; and so on. Furthermore, the gates 243a-243c of all of the transistors 250a-250c will have essentially co-planar top surfaces adjacent to the dielectric gate caps 263 and essentially co-planar bottom surfaces adjacent to the substrate 204 such that the heights 245a-245c of those gates 243a-243c are essentially equal.

Additional processing can be performed in order to complete the integrated circuit (IC) structure (see process 128). This additional processing can include, but is not limited to, formation of metal plugs on the source/drain regions, formation of middle of the line (MOL) contacts to the RMGs and the metal plugs, formation of back end of the line (BEOL) wiring, etc.

Referring to FIGS. 14A-14E, also disclosed herein are embodiments of an integrated circuit (IC) structure 200 formed according to the above-described method. The IC structure 200 can include a static random access memory (SRAM) array with six-transistor (6T) SRAM cells that incorporates multiple gate-all-around field effect transistors (GAAFETs) having different drive currents. Alternatively, the IC structure could be any other type of circuit structure that incorporates multiple GAAFETs having different drive currents.

Specifically, the IC structure 200 can include a substrate 201. The substrate 201 can be a bulk semiconductor substrate made of a first semiconductor material 204 (e.g., silicon).

The IC structure 200 can further include multiple GAAFETs on the substrate 201. These GAAFETS can include at least one first transistor 250a, at least one second transistor 250b and, optionally, at least one third transistor 250c. For example, in the case of an SRAM cell, the IC structure can include two first transistors 250a (i.e., the left-side and right-side N-type pull-down transistors PD-L and PD-R); two second transistors 250b (i.e., left-side and right-side N-type pass-gate transistors PG-L and PG-R); and two the third transistors 250c (i.e., the left-side and right-side P-type pull-up transistors PU-L and PU-R).

Each first transistor 250a (e.g., PD-L and PD-R) can have first source/drain regions 241a on the substrate 201 and multiple first channel regions and, particularly, multiple horizontally oriented first nanoshapes 244a, which extend laterally between the first source/drain regions 241a. Specifically, the first nanoshapes 244a can be parallel to the top surface of the substrate 201, parallel to each other, and stacked one above the other. The lowest first nanoshape can be separated from the top surface of the substrate 201 by a space and additional first nanoshapes 244a can be separated from each other by spaces. Each first transistor 250a can further include a first gate 243a. The first gate 243a can wrap around the first nanoshapes 244a (e.g., filling the spaces between the substrate 201 and lowest first nanoshape, on the sides of the first nanoshapes, between the first nanoshapes and above the highest first nanoshape).

Each second transistor 250b (e.g., PG-L and PG-R) can have second source/drain regions 241b on the substrate 201 and one or more second channel regions and, particularly, one or more horizontally oriented second nanoshapes 244b, which extend laterally between the second source/drain regions 241b. The number of second nanoshapes 244b in each second transistor 250b can specifically be less than the number of first nanoshapes 244a in each first transistor 250a. When each second transistor 250b only has a single second nanoshape 244b, the second nanoshape is parallel to the top surface of the substrate 201 and separated from the top surface of the substrate 201 by a space. When each second transistor 250b has multiple second nanoshapes 244b, the second nanoshapes 244b can be parallel to the top surface of the substrate, parallel to each other, and stacked one above the other. The lowest second nanoshape can be separated from the top surface of the substrate 201 by a space and additional second nanoshapes 244b can be separated from each other by spaces. In any case, each second transistor 250b can further include a second gate 243b. The second gate 243b can wrap around each second nanoshape(s) 244b.

Each third transistor 250c (e.g., PU-L and PU-R) can have third source/drain regions 241c on the substrate 201 and one or more third channel regions and, particularly, one or more horizontally oriented third nanoshapes 244c, which extend laterally between the third source/drain regions 241c. The number of third nanoshapes 244c in each third transistor 250c can be the same as the number of second nanoshapes in the second transistor or, optionally, can be less than the number of second nanoshapes 244b in each second transistor 250b. When each third transistor 250c only has a single third nanoshape 244c, the third nanoshape is parallel to the top surface of the substrate 201 and separated from the top surface of the substrate 201 by a space. When each third transistor 250b has multiple third nanoshapes 244c, the third nanoshapes 244c can be parallel to the top surface of the substrate, parallel to each other, and stacked one above the other. The lowest third nanoshape can be separated from the top surface of the substrate 201 by a space and additional third nanoshapes 244c can be separated from each other by spaces. In any case, each third transistor 250c can further include a third gate 243c. The third gate 243c can wrap around each third nanoshape(s) 244c.

For purposes of illustration the first transistor 250a is illustrated in the figures as having three first nanoshapes 244a (i.e., three first channel regions), the second transistor 250b is illustrated in the figures as having two second nanoshapes 244b (i.e., two second channel regions), and the third transistor 250c is illustrated in the figures as having one third nanoshape 244c (i.e., one third channel region). However, it should be understood that the figures are not intended to be limiting. Alternatively, the first transistor 250a can have any number of multiple nanoshapes 244a (i.e., any number of multiple channel regions), the second transistor 250b can have fewer nanoshapes 244b (i.e., fewer channel regions) than the first transistor 250a and the third transistor 250c can have the same or fewer nanoshapes 244c than the second transistor 250b. As a result, each second transistor 250b has a lower drive current than each first transistor 250a and each third transistor 250c has the same or a lower drive current than each second transistor 250b. Since the third transistor 250c has fewer channel regions 244c than the second transistor 250b, the third transistor 250c will have a lower drive current than the second transistor. It should be noted that, due to the method used to form the transistors 250a-250c, the lowest nanoshape (i.e., the lowest channel region or, more particularly, the channel region closest to the substrate 204) in each transistor (see transistors 250a-250c) are at the same level; the next lowest nanoshape in each transistor, if any (see transistors 250a-250b) are similarly at the same level but at a higher level than the lowest channel region; and so on.

In any case, in each of the transistors 250a-250b described above, the gates 243a-243c can be, for example, replacement metal gates (RMGs). The RMGs can each include a gate dielectric layer (e.g., a high-K gate dielectric layer) immediately adjacent to and surrounding the exposed surfaces of the elongated nanoshapes 244a-244c, respectively. Each gate 243a-243c can further include a conformal work function metal layer immediately adjacent to the gate dielectric layer, wrapping around the nanoshape(s) 244a-244c. The metal material or metal alloy material of the conformal work function metal layer can be preselected in order to achieve the optimal gate conductor work function given the conductivity type of the transistor. Each gate 243a-243c can further include a conductive fill material on the conformal work function metal layer. These gates 243a-243c can further have gate sidewall spacers 261 positioned laterally adjacent to the sidewalls of the gate and dielectric gate caps 263 on the tops of the gates. Since various RMG structures and the methods of making them are well known in the art and could be incorporated into the transistor 250a-250c, only the RMGs 243a-243c, as a whole, are identified in FIGS. 14A-14E. In order to avoid clutter in the drawings and allow the reader to focus on the salient aspects of the disclosed method, the individual components of the RMGs 243a-243c, including the gate dielectric layer, the work function metal layer, the conductive fill material, etc., are not specifically identified or illustrated. In any case, the RMGs 243a-243c of all of the transistors 250a-250c have essentially co-planar top surfaces adjacent to the dielectric gate caps 263 and essentially co-planar bottom surfaces adjacent to the substrate 204 such that the heights 245a-245c of those RMGs 243a-243c are essentially equal.

Additionally, in each of the transistors 250a-250c described above, isolation regions 265 can provide electrical isolation between the gates 243a-243c and the adjacent source/drain regions 241a-241c, respectively. Specifically, the isolation regions 265 can be aligned below the gate sidewall spacers 261 and can be above and below the ends of the nanoshapes such that each source/drain region of a transistor has a side that abuts one end of each of the nanoshape(s) of that transistor as well as isolation regions 265 above and below those nanoshape(s).

In such an IC structure and, particularly, in an SRAM cell where the first transistors 250a are N-type pull-down transistors (PD-L and PD-R) and the second transistors 250b are N-type pass-gate transistors (PG-L and PG-R) of the same SRAM cell, the lower drive current of the N-type pass-gate transistors relative to the drive current of the N-type pull-down transistors balances out the conflicting requirements for Ion_PG in the gamma and beta ratios in the SRAM cell and, thereby improves soft yield (i.e., to minimize soft errors or memory write or read fails). Furthermore, if the third transistors 250c are P-type pull-up transistors of the same SRAM cell, the lower drive current of the P-type pull-up transistors further improves SRAM cell performance.

As discussed above with regard to both the method and structure embodiments, the first and second transistors 250a and 250b (e.g., the pull-down and pass-gate transistors) can be N-type GAAFETs and the third transistors 250c (e.g., the pull-up transistors) can be P-type GAAFETs.

For both the N-type GAAFETs and the P-type GAAFETs, the channel regions (i.e., the nanoshapes) will be made of the same semiconductor material 204 (e.g., silicon). The source/drain regions for both the N-type GAAFETs and the P-type GAAFETs can also be made of the same semiconductor material (e.g., silicon). However, alternatively, the semiconductor material deposited for the different type FETs could be different and specifically could be preselected to enhance charge carrier mobility in the different FETs. For example, for P-type GAAFETs, the source/drain regions could be silicon germanium (SiGe), which will enhance hole mobility within the P-type GAAFET channel regions and, thereby enhance performance. For N-type GAAFETs, the source/drain regions could be silicon carbide (SiC) or some other silicon-based semiconductor material, which will enhance electron mobility within the N-type GAAFET channel regions and, thereby enhance performance.

Additionally, for the N-type GAAFETs, the channel region(s) (i.e., the nanoshapes) can have P-type conductivity at a relatively low conductivity level (or can be undoped) and the source/drain regions can have N-type conductivity at a relatively high conductivity level; whereas, for the P-type GAAFET, the channel region(s) (i.e., the nanoshapes) can have N-type conductivity at a relatively low conductivity level (or can be undoped) and the source/drain regions can have P-type conductivity at a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Those skilled in the art will also recognize that different conductivity levels will depend upon the relative concentration levels of the dopants.

Additionally, for N-type GAAFETs, the RMGs gates can have a first work function and, for P-type GAAFETs, the RMGs gates can have a second work function that is different from the first work function. Specifically, the RMGs can have a high-K gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal gate conductor work function of the N-type GAAFETs can be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for the P-type GAAFETs can be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming, on a substrate that comprises a first semiconductor material, a multi-layer stack comprising alternating layers of a second semiconductor material and the first semiconductor material;
   forming a recess in the multi-layer stack such that a first area of the multi-layer stack has more layers of the first semiconductor material than a second area of the multi-layer stack;
   filling the recess with a sacrificial material;
   after the filling of the recess with the sacrificial material, patterning the multi-layer stack into multi-layer fins comprising at least a first fin in the first area and a second fin in the second area, wherein the first fin comprises the alternating layers and wherein the second fin comprises the sacrificial material above at least one layer of the first semiconductor material; and
   forming transistors comprising: a first transistor comprising multiple first nanoshapes for multiple first channel regions formed using multiple layers of the first semiconductor material in the first fin; and a second transistor comprising at least one second nanoshape for at least one second channel region formed using the at least one layer of the first semiconductor material in the second fin,
   wherein the first transistor is formed so as to have a first number of the first nanoshapes and the second transistor is formed so as to have a second number of the second nanoshapes that is less than the first number, and
   wherein each second nanoshape is essentially co-planar with one of the first nanoshapes.

2. The method of claim 1, wherein the first transistor has a first drive current and the second transistor has a second drive current that is lower than the first drive current.

3. The method of claim 1, the first semiconductor material comprising silicon and the second semiconductor material comprising silicon germanium.

4. The method of claim 1, the second semiconductor material and the sacrificial material comprising monocrystalline silicon germanium.

5. The method of claim 1, the second semiconductor material comprising monocrystalline silicon germanium and the sacrificial material comprising polycrystalline silicon germanium.

6. The method of claim 1, the forming of the transistors comprising:
   forming sacrificial gates with sidewall spacers on a first portion of the first fin and on a first portion of the second fin;
   removing second portions of the first fin and second portions of the second fin that extend laterally beyond the sacrificial gates and the sidewall spacers to expose, on both the first portion of the first fin and the first portion of the second fin, vertical surfaces of the first semiconductor material and vertical surfaces of the second semiconductor material;

laterally etching the exposed vertical surfaces of the second semiconductor material on both the first portion of the first fin and the first portion of the second fin;

depositing isolation material on the exposed vertical surfaces of the second semiconductor material on both the first portion of the first fin and the first portion of the second fin;

epitaxially growing first source/drain regions for the first transistor adjacent to the exposed vertical surfaces of the first semiconductor material on the first fin and epitaxially growing second source/drain regions for the second transistor adjacent to the exposed vertical surfaces of the first semiconductor material on the second fin;

selectively removing the sacrificial gates to form gate openings, the gate openings comprising a first gate opening that exposes the first portion of the first fin and a second gate opening that exposes the first portion of the second fin;

selectively etching away the second semiconductor material from the first portion of the first fin exposed in the first gate opening and selectively etching away the second semiconductor material and the sacrificial material from the first portion of the second fin exposed in the second gate opening; and forming replacement metal gates in the gate openings.

7. The method of claim 1, wherein the first transistor is a pull-down transistor of a static random access memory cell and the second transistor is a pass-gate transistor of the static random access memory cell.

8. A method comprising:

forming, on a substrate that comprises a first semiconductor material, a multi-layer stack comprising alternating layers of a second semiconductor material and the first semiconductor material;

forming recesses in the multi-layer stack, wherein at least two of the recesses extend to different depths within the multi-layer stack such that a first area of the multi-layer stack has more layers of the first semiconductor material than a second area of the multi-layer stack and further such that the second area of the multi-layer stack has more layers of the first semiconductor material than a third area of the multi-layer stack;

filling the recesses with a sacrificial material;

after the filling of the recesses with the sacrificial material, patterning the multi-layer stack into multi-layer fins comprising at least a first fin in the first area, a second fin in the second area, and a third fin in the third area, wherein the first fin comprises the alternating layers, wherein the second fin comprises the sacrificial material above at least two layers of the first semiconductor material and has fewer layers of the first semiconductor material than the first fin, wherein the third fin comprises the sacrificial material above at least one layer of the first semiconductor material and has fewer layers of the first semiconductor material than the second fin, and wherein the sacrificial material in the third fin is thicker than the sacrificial material in the second fin;

forming transistors comprising: a first transistor comprising multiple first nanoshapes for multiple first channel regions formed using multiple layers of the first semiconductor material in the first fin; a second transistor comprising at least two second nanoshapes for at least two second channel regions formed using the at least two layers of the first semiconductor material in the second fin; and a third transistor comprising at least one third nanoshape for at least one third channel region formed using the at least one layer of the first semiconductor material in the third fin, wherein the first transistor is formed so as to have a first number of the first nanoshapes, the second transistor is formed so as to have a second number of the second nanoshapes that is less than the first number, and the third transistor is formed so as to have a third number of third nanoshapes that is less than the second number, and wherein each second nanoshape is essentially co-planar with one of the first nanoshapes and each third nanoshape is essentially co-planar with both one of the first nanoshapes and one of the second nanoshapes.

9. The method of claim 8, wherein the first transistor has a first drive current, the second transistor has a second drive current that is lower than the first drive current, and the third transistor has a third drive current that is lower than the second drive current.

10. The method of claim 8, the first semiconductor material comprising silicon and the second semiconductor material comprising silicon germanium.

11. The method of claim 8, the second semiconductor material and the sacrificial material comprising monocrystalline silicon germanium.

12. The method of claim 8, the second semiconductor material comprising monocrystalline silicon germanium and the sacrificial material comprising polycrystalline silicon germanium.

13. The method of claim 8, the forming of the transistors comprising:

forming sacrificial gates with sidewall spacers on a first portion of the first fin, on a first portion of the second fin, and on a first portion of the third fin;

removing second portions of the multi-layer fins that extend laterally beyond the sacrificial gates and the sidewall spacers;

laterally etching exposed vertical surfaces of the second semiconductor material;

following the etching of the exposed vertical surfaces of the second semiconductor material, depositing isolation material on the exposed vertical surfaces of the second semiconductor material;

epitaxially growing first source/drain regions for the first transistor adjacent to exposed surfaces of the first semiconductor material of the first fin, second source/drain regions for the second transistor adjacent to exposed surfaces of the first semiconductor material of the second fin, and third source/drain regions for the third transistor adjacent to exposed surfaces of the first semiconductor material of the third fin;

selectively removing the sacrificial gates to form gate openings;

selectively etching away the second semiconductor material and any of the sacrificial material in the gate openings; and forming replacement metal gates in the gate openings.

14. The method of claim 8, wherein the first transistor is a pull-down transistor of a static random access memory cell, the second transistor is a pass-gate transistor of the static random access memory cell, and the third transistor is a pull-up transistor of the static random access memory cell.

15. An integrated circuit structure comprising:
a substrate;
a memory cell on the substrate, the memory cell comprising:
  a first transistor comprising:
    a first source region on the substrate;
    a first drain region on the substrate;
    a first number of first nanoshapes extending laterally between the first source region and the first drain region, wherein the first nanoshapes are parallel to a top surface of the substrate, physically separated and stacked vertically and wherein each first nanoshape comprises a first channel region; and
    a first gate wrapping around the first nanoshapes; and
  a second transistor comprising:
    a second source region on the substrate;
    a second drain region on the substrate;
    a second number of second nanoshapes extending laterally between the second source region and the second drain region, wherein the second nanoshapes are parallel to the top surface of the substrate, physically separated and stacked vertically, wherein each second nanoshape is essentially co-planar with one of the first nanoshapes, wherein each second nanoshape comprises a second channel region and wherein the second number is less than the first number such that the first transistor has a first drive current and the second transistor has a second drive current that is less than the first drive current; and
    a second gate wrapping around the second nanoshapes, wherein top surfaces of the first gate and the second gate are essentially co-planar and wherein heights of the first gate and the second gate are equal.

16. The integrated circuit structure of claim 15, the first nanoshapes and the second nanoshapes comprising any of nanowires, nanosheets and nanofins.

17. The integrated circuit structure of claim 15, the first nanoshapes and the second nanoshapes comprising silicon nanoshapes.

18. The integrated circuit structure of claim 15, the memory cell further comprising silicon germanium oxide isolation regions that physically separate and electrically isolate the first gate from the first source region and the first drain region and that further physically separate and electrically isolate the second gate from the second source region and the second drain region.

19. The integrated circuit structure of claim 15, the memory cell further comprising a third transistor comprising:
  a third source region on the substrate;
  a third drain region on the substrate
  a third number of third nanoshapes extending laterally between the third source region and the third drain regions, wherein any third nanoshapes are parallel to the top surface of the substrate, physically separated and stacked vertically, wherein each third nanoshape is essentially co-planar with one of the second nanoshapes and one of the first nanoshapes, wherein each third nanoshape comprises a third channel region, and wherein the third number is equal to one or more and is less than the second number such that the third transistor has a third drive current that is less than the second drive current of the second transistor; and
  a third gate wrapping around the third nanoshapes.

20. The integrated circuit structure of claim 15,
wherein the memory cell comprises a static random access memory cell,
wherein the first transistor is an N-type pull-down transistor and the second transistor is an N-type pass-gate transistor,
wherein the N-type pass-gate transistor has an on-current,
wherein requirements for the on-current of the N-type pass-gate transistor are different during different operations of the static random access memory cell, and
wherein the first drive current of the first transistor is greater than the second drive current of the second transistor to balance out different requirements for the on-current of the N-type pass-gate transistor and minimize soft errors.

* * * * *